US006252464B1

United States Patent
Richards et al.

(10) Patent No.: US 6,252,464 B1
(45) Date of Patent: Jun. 26, 2001

(54) NUMERICALLY-CONTROLLED NYQUIST-BOUNDARY HOPPING FREQUENCY SYNTHESIZER

(75) Inventors: Wayne Edward Richards, La Mesa; Jeffrey Morris Keefer, San Diego, both of CA (US)

(73) Assignee: Cubic Defense Systems, Inc., San Diego, CA (US)

( * ) Notice: Subject to any disclaimer, the term of this patent is extended or adjusted under 35 U.S.C. 154(b) by 0 days.

(21) Appl. No.: 09/414,081

(22) Filed: Oct. 6, 1999

(51) Int. Cl.[7] .......................................... H03L 7/00
(52) U.S. Cl. ........................ 331/4; 331/25; 331/178; 327/107; 708/271; 375/376
(58) Field of Search .................. 331/4, 178, 25; 327/107, 105; 708/271; 375/376

(56) References Cited

U.S. PATENT DOCUMENTS

| | | | |
|---|---|---|---|
| 3,593,204 | 7/1971 | Healey, III | 332/30 |
| 4,926,130 | 5/1990 | Weaver | 327/105 |
| 5,146,187 | 9/1992 | Vandegraaf | 331/17 |
| 5,521,532 | 5/1996 | Gumm | 327/105 |
| 5,886,752 | 3/1999 | Cross | 348/724 |

Primary Examiner—Arnold Kinkead

(74) Attorney, Agent, or Firm—Michael H. Jester

(57) ABSTRACT

An inexpensive numerically-controlled fast frequency-hopping microwave synthesizer. A voltage-controlled oscillator (VCO) output phase remains locked to an internal direct digital synthesizer (DDS) reference signal over the entire output frequency band, which is an order of magnitude larger than the internal sampling clock frequency. A "Nyquist-boundary hopping" scheme compares signals from an alias band of the DDS with signals from an alias band of the sampled VCO output to derive an output phase error signal, which is forced to zero in a manner that locks the VCO output phase to the DDS output phase over a frequency hop-distance greater than the DDS bandwidth. Accordingly, in a single second, the synthesizer can hop phase-continuously in a single clock cycle to each of hundreds of thousands of different microwave output frequencies with relatively low clock rates (up to 100 MHz) commensurate with silicon application-specific integrated circuits (ASICs). Synthesizer performance is enhanced by several other features, such as a digital "whitening" filter to compensate for the anti-aliasing effects of the analog filters employed, a digital VCO control linearization loop to adaptively compensate for the effects of VCO and digital-to-analog convertor (DAC) nonlinearities, a digital cyclic error removal loop to adaptively compensate for the effects of elliptical distortion in the complex output phase samples, and a Sigma-Delta quantizer to provide a higher DAC resolution with inexpensive DACs while minimizing quantizing noise effects in the output signal.

38 Claims, 17 Drawing Sheets

PREFERRED

FIRST ALTERNATIVE

SECOND ALTERNATIVE

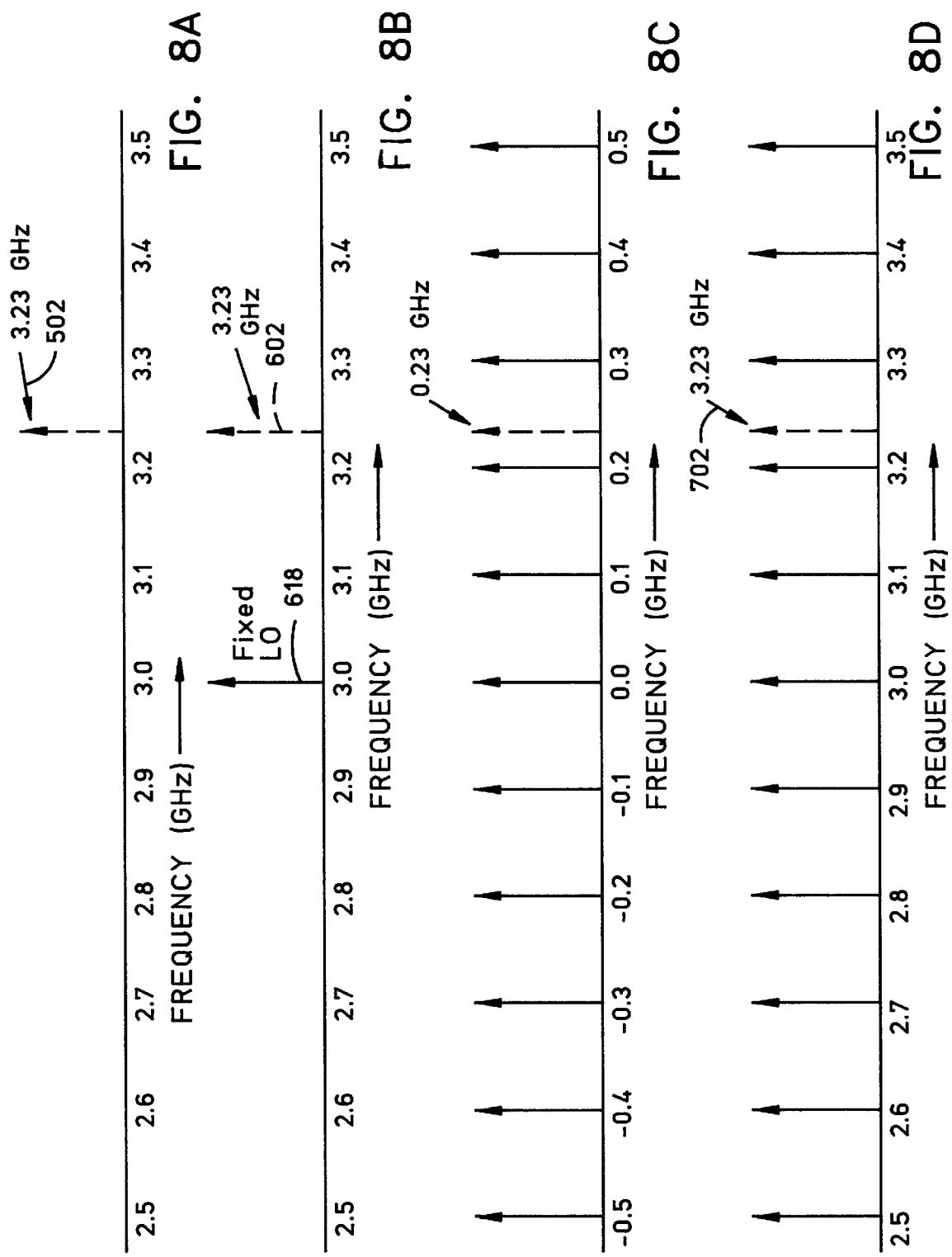

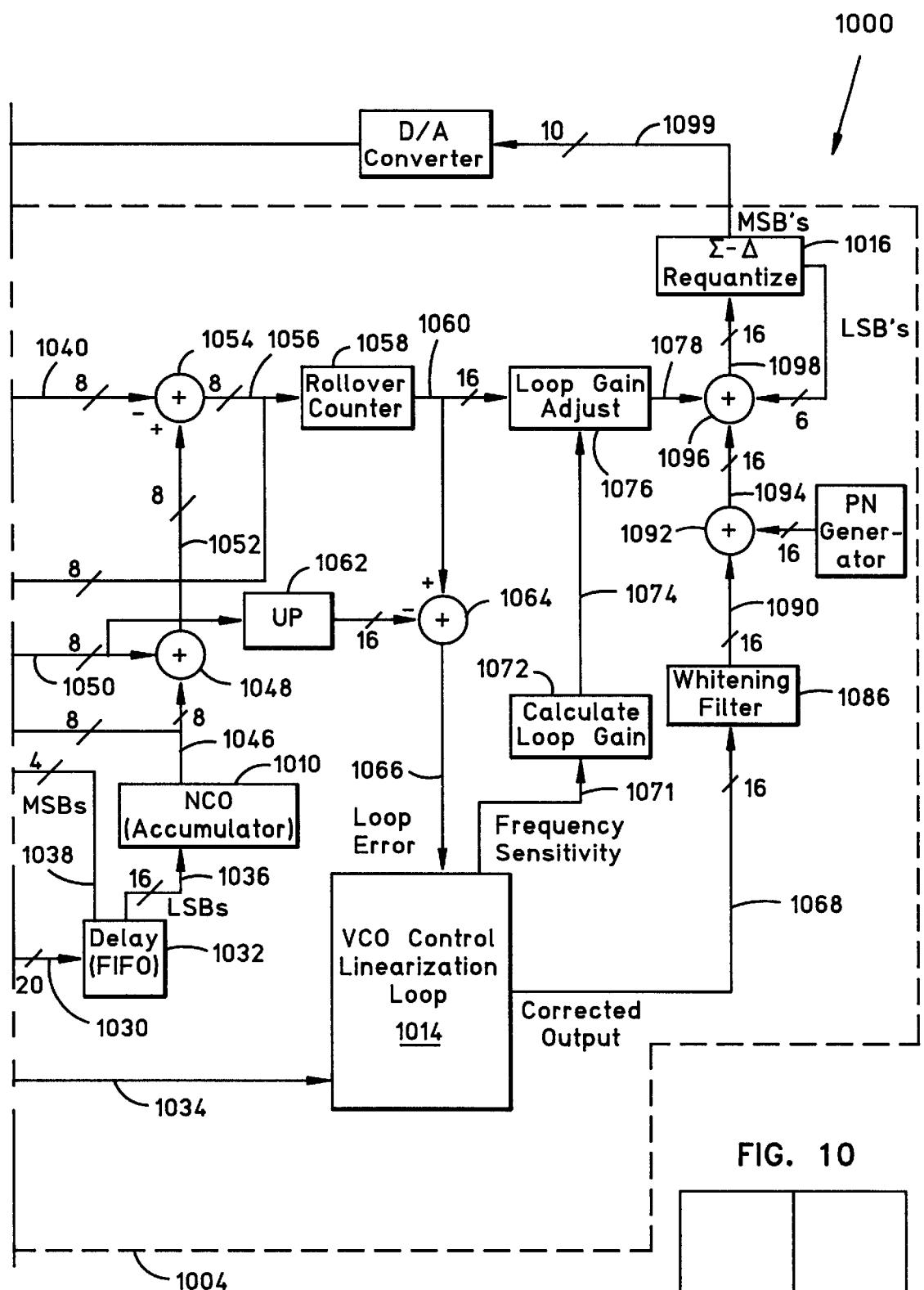
FIG. 10B
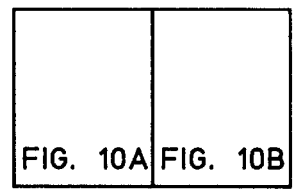

NUMERICALLY-CONTROLLED NYQUIST-BOUNDARY HOPPING FREQUENCY SYNTHESIZER

BACKGROUND OF THE INVENTION

1. Field of the Invention

This invention relates generally to digitally-controlled microwave-frequency signal synthesizers and, more particularly, to a numerically-controlled fast-hopping frequency synthesizer employing a "Nyquist-Boundary Hopping" signal alias phase-locking scheme.

2. Description of the Related Art

Microwave voltage-controlled oscillators (VCOs) are well-known in the art and are seen in many microwave communications devices. For instance, in U.S. Pat. No. 3,593,204, Healey discloses a simple analog high-frequency VCO with a phase lock loop that does not employ any digital frequency synthesizer techniques. The analog VCO characteristics are slightly nonlinear and tend to drift with time and temperature and the thermal noise in any analog control voltage operates to frequency-modulate the VCO output frequency undesirably. Also, random frequency and phase modulation noise results from random noise in the oscillator and the limited Q of any analog frequency-control network.

These problems are commonly mitigated by phase-locking the VCO to a high-quality stable frequency reference. It is also often desired to cause the VCO to tune over a wide output frequency band. For instance, in a spread-spectrum communications transmitter, a microwave VCO may be required to rapidly tune over half an octave from about 2,500 MHz to 3,500 MHz to handle frequency-hops spanning most of the entire band without loss of phase coherency. This requires some arrangement to retain (or quickly regain) the microwave VCO phase lock to the lower (and more stable) reference frequency while moving from one microwave frequency to another in its band or while changing bands. As an illustration of the solutions proposed by various practitioners, U.S. Pat. No. 5,146,187 issued to Vandegraaf discloses an adaptive loop filter for synthesizer applications that improves phase-lock performance during band-switching.

Digital reference sources are sometimes preferred as reference sources because they are stable but they also are problematic because of the spurious noise created by the quantization effect during digital-to-analog conversion. Careful management of sampling and clocking frequencies can resolve this well-known problem. For instance, in U.S. Pat. No. 4,926,130, Weaver discloses a synchronous up-conversion technique that creates a high frequency by mixing a direct digital synthesizer (DDS) output with a stable high-frequency reference signal whose frequency is fixed at an integer (N) multiple of the frequency of a digital-to-analog converter (DAC) sampling clock. A second up-conversion stage may be added by mixing the intermediate result with another stable reference signal frequency fixed at an integral (M) multiple of the sampling clock frequency. This method provides a final stepped-up output signal frequency that retains the spectrum of the DDS reference without creating new spurs.

Weaver teaches away from using DDS alias frequencies to control higher output frequencies, citing unacceptable and unfilterable noise spurs in the output signal. But, in U.S. Pat. No. 5,886,752, Cross discloses a wideband phase and frequency modulator that employs one of the DDS alias frequency bands in a manner that permits him to broaden the available modulation bandwidth. Cross controls the quantization noise spurs by operating the DDS at a sampling clock frequency submultiple. He suggests that any tuning range desired can be had by adding another frequency synthesizer. Cross prefers using the first DDS alias band as the modulation reference to which the up-converted output frequency is locked using a mixer in the usual manner. However, like Weaver, Cross does not consider solutions to the problems seen in phase-locking the up-converted output signal to the DDS output reference.

A simple phase-locking technique is to sample the instantaneous VCO output amplitude at a submultiple of the VCO frequency and use the resulting phase error signal to control the VCO frequency. For instance, a sampling circuit commonly denominated a phase gate is often used for this purpose. It is an electronic switch that periodically closes for a very short period (e.g. 50 ps) at a rate precisely controlled by a reference clock signal. As is well-known, this switch will produce output signals (aliases) that correspond to the frequency differences between the microwave VCO output frequency and the several harmonics of the reference signal frequency. As is well-known, the phase gate sample time must be less than the reciprocal of the signal frequency for which a useful sample stream is desired.

For example, assume the signal from a microwave VCO designed to operate at 3,000 MHz is sent to a sampling gate that is driven by a stable 2 MHz reference signal. The difference signal from the phase gate includes a plurality of components at frequencies equal to the 3,000 MHz VCO output and an integral multiple of the 2 MHz reference. The 1,500th harmonic of the reference signal is at 3,000 MHz. If the VCO frequency is slightly high; say, 3,000.5 MHz, the phase gate output signal includes a corresponding 0.5 MHz component. The same component is obtained if the VCO frequency is 2,999.5 MHz. This 0.5 MHz signal can be passed through a suitable network to the VCO control terminal, causing the VCO frequency to eventually settle at exactly 3,000 MHz. The advantage of this well-known technique is that the excellent frequency drift and phase noise characteristics of a high-quality (low frequency) reference oscillator (such as a DDS) can be transferred with relatively simple hardware to a much less stable microwave VCO. The disadvantage is also well-known; that is the similar transfer of reference oscillator range and rate limitations.

Consider such a microwave VCO output frequency locked to the 30th harmonic of a 100 MHz reference oscillator. If the reference drifts by 1 kHz, the VCO output frequency drifts 30 kHz. Similarly, the VCO output phase noise is 30 times as bad as the reference oscillator phase noise impressed upon it over the bandwidth of the phase lock loop. This is why the reference signal must be very stable. But it is difficult and expensive to create a widely-tunable reference signal that is also very stable. Instead, the stable reference signal is tuned only over a small region so that the VCO may be locked on the Nth harmonic of the reference signal at one reference extreme and on the (N+1)th harmonic at the other. This permits tuning the microwave VCO by locking it to the reference frequency; so, for instance, a 3,000 MHz VCO locked to the $30^{th}$ harmonic of a 100 MHz reference that is tunable over a ±3% range, can be tuned over the range from 2,910 to 3,090 MHz.

But this solution introduces another problem when it is desired to tune or sweep the microwave VCO beyond the range where the reference signal can tune. In one solution, the tuning range of the reference signal is extended a bit to allow some overlap of the lock range of the microwave VCO. Tuning over a wider range obliges the system to halt, unlock the microwave VCO, retune the reference oscillator to the other end of its range, and re-lock the microwave VCO to the next reference harmonic. Obtaining a lock by the microwave VCO to the correct harmonic of the reference can be a slow process that loses useful carrier cycles.

In U.S. Pat. No. 5,521,532, Gumm discloses a broadband DDS-controlled microwave signal source that locks the output frequency and phase to successive harmonic bands of a submultiple clock-frequency DDS output signal. This method solves the problem of how to extend the VCO frequency range while locking to a narrow-band reference oscillator but imposes some restrictions on certain other desirable capabilities. As the VCO frequency is swept monotonically, the DDS reference harmonic band is stepped without phase discontinuity from N to (N+1) or (N−1), retaining the VCO phase-lock as the DDS reference signal abruptly hops from one end of its frequency range to the other. Gumm discloses an elaborate digital frequency-hopping controller needed to force the DDS output frequency from one end to the other of its band without losing phase-continuity. However, while Gumm shows how to lock the broad-band VCO to the more stable narrow-band DDS reference during a leisurely and continuous sweep over many multiples of the DDS reference frequency band, he neither considers nor suggests how to maintain this phase lock during abrupt hops from one VCO frequency to another.

Because of these well-known difficulties, typical frequency-hopped microwave synthesizers are designed using mostly analog components. A stable reference frequency is used to derive each selected frequency output by frequency multiplication, fractional-N synthesis, or other approaches. For high-rate hopping, ultra high-speed PIN diodes or similar circuitry are used to quickly switch between multiples of this reference. A primary disadvantage of these approaches is that the analog circuitry is costly and yields are poor. Moreover, such solutions do not retain phase-continuity and each hop requires many output cycles to regain phase-lock. The DDS approaches discussed above are usually limited to hopping over a small portion of the output frequency band because the sample rates required to hop over larger distances exceed twice the Nyquist rate and require GaAs components or other expensive technologies.

It is desirable to resolve these problems by providing a microwave synthesizer that can be phase-continuously hopped over gigahertz ranges using only a mature inexpensive technology such as silicon CMOS or field-programable gate arrays (FPGAs). Until now, this has not been possible because of the well-known limitations discussed above. These unresolved problems and deficiencies are clearly felt in the art and are solved by this invention in the manner described below.

SUMMARY OF THE INVENTION

It is a purpose of this invention to provide a fast-hopping digital microwave frequency synthesizer that can be implemented primarily with inexpensive digital components.

In one aspect, this invention is a machine-implemented method for generating an output signal that hops from a first output frequency to a second output frequency within an output frequency band responsive to an input signal representing the desired output signal, the method comprising the steps of generating a clock frequency, generating a digital phase signal representing the phase of a sampling-induced alias of the output signal, generating a digital reference signal representing the phase of an alias of the desired output signal, the alias having a frequency within a reference frequency band having a bandwidth within the Nyquist sampling-limits of the clock frequency, and generating the output signal as a function of a combination of the digital reference signal and the digital phase signal, whereby the output signal frequency is controlled by a combination of the desired output signal alias and the sampling-induced output signal alias.

It is an advantage of this aspect of the invention that a gigahertz-bandwidth synthesizer can be implemented that can hop phase-continuously in a single clock cycle to each of hundreds of thousands of different microwave output frequencies during one second using clock rates commensurate with silicon application-specific integrated circuit (ASIC) clock rates (up to 100 MHz).

Another aspect of the invention is a numerically-controlled fast-hopping frequency synthesizer for the gigahertz microwave region. A voltage-controlled oscillator (VCO) output phase remains locked to an internal direct digital synthesizer (DDS) reference signal over the entire output frequency band, which spans an order of magnitude more than the internal sampling clock frequency in the CMOS region. This improvement is accomplished by means of a "Nyquist-boundary hopping" scheme that compares DDS signals representing an alias of the desired output signal with a sampling-induced alias of the VCO output to derive a phase error signal, which is forced to zero in a manner that locks the VCO output phase to the DDS signal representing a desired output phase.

It is an advantage of this aspect of the invention that the synthesizer embodiment requires a minimum of RF analog circuitry and employs digital signal processing for many functions that were formerly implemented in the analog domain. Aliasing is exploited to reduce the sampling rate needed for high hop bandwidth using lower-cost silicon technology rather than the gallium-arsenide technology typically required for synthesizers with gigahertz operating bandwidths.

The preferred embodiment is facilitated by several other features, including: a digital "whitening" filter to compensate for the anti-aliasing effects of the analog filters employed; a dynamic VCO linearization loop to adaptively minimize the effects of VCO and digital-to-analog convertor (DAC) nonlinearities; a dynamic cyclic error removal (CER) loop to adaptively eliminate any elliptical distortion component in the trajectory of the phasor derived from the output sample alias components; and a Sigma-Delta requantizer to randomly dither available DAC resolution, thereby providing an average desired resolution while spreading the remaining quantizing error and minimizing quantizing noise density in the output, particularly near the (typically DC) VCO control signal frequency.

In another aspect, the invention is a fast frequency-hopping synthesizer apparatus for generating an output signal that hops from a first output signal frequency to a second output signal frequency within an output frequency band responsive to an input signal representing a desired output signal, the apparatus comprising a clock circuit generating a clock frequency, an output phase sampler coupled to the clock circuit and generating a digital phase signal representing the phase of a sampling-induced alias of the output signal, a numerically-controlled oscillator coupled to the clock circuit and producing a digital reference signal representing the phase of an alias of the desired output signal, the alias having a frequency within a reference frequency band having a bandwidth within the Nyquist sampling-limits of the clock frequency, a phase control circuit coupled to the numerically-controlled oscillator and to the output phase sampler and generating a control signal representing a combination of the digital reference signal and the digital phase signal, and a voltage-controlled oscillator coupled to the phase control circuit and generating the output signal responsive to the control signal, whereby the output signal frequency is controlled by a combination of the desired output signal alias and the sampling-induced output signal alias.

It is yet another advantage of this invention that phase-lock is maintained over a frequency hop-distance greater than the DDS reference frequency bandwidth because a DDS signal representing an alias of the desired output frequency is compared to a sampling-induced alias of the sampled VCO output to derive a signal representing the VCO output phase error. Although the particular output signal alias employed to produce the output phase error signal shifts as the output frequency slews, such alias-shifting is phase-continuous so the phase error signal is continuously available during an output frequency hop.

It is a feature of this invention that it is suitable for low-cost implementation using commercially-available data conversion, memory, and radio frequency (RF) hardware components known in the art. It is another feature of this invention that it is suitable for frequency-hopped code division multiple access (CDMA) communication systems, wireless local area networks (LANs) and wide area networks (WANs) using frequency agility for improved multi-path interference suppression, and jam-resistant electronic warfare communications.

The foregoing, together with other features and advantages of this invention, can be better appreciated with reference to the following specification, claims and the accompanying drawing.

BRIEF DESCRIPTION OF THE DRAWINGS

For a more complete understanding of this invention, reference is now made to the following detailed description of the embodiments illustrated in the accompanying drawing, wherein:

FIGS. 8A–8D illustrate the various signal spectra related to the phase sampling processes of FIGS. 5–7;

FIG. 10, comprising FIGS. 10A–10B, illustrates a block diagram showing the basic digital elements of an illustrative embodiment of the fast frequency-hopping microwave synthesizer of the invention;

DESCRIPTION OF THE PREFERRED EMBODIMENTS

Introduction to the Inventive Concept

This invention implements a microwave VCO locked to a stable DDS using a sampling rate supported by CMOS technology by better exploiting the concept of aliasing described herein. Samples from an output signal alias band and a DDS alias band are compared to derive an error signal that is used to lock the VCO output phase to the DDS reference phase and to maintain the phase-lock during frequency hops over spans many times greater than the DDS signal bandwidth. Additional dynamic control loops are provided to correct certain errors and nonlinearities encountered with this new Nyquist-boundary-hopping technique.

Figure 1:
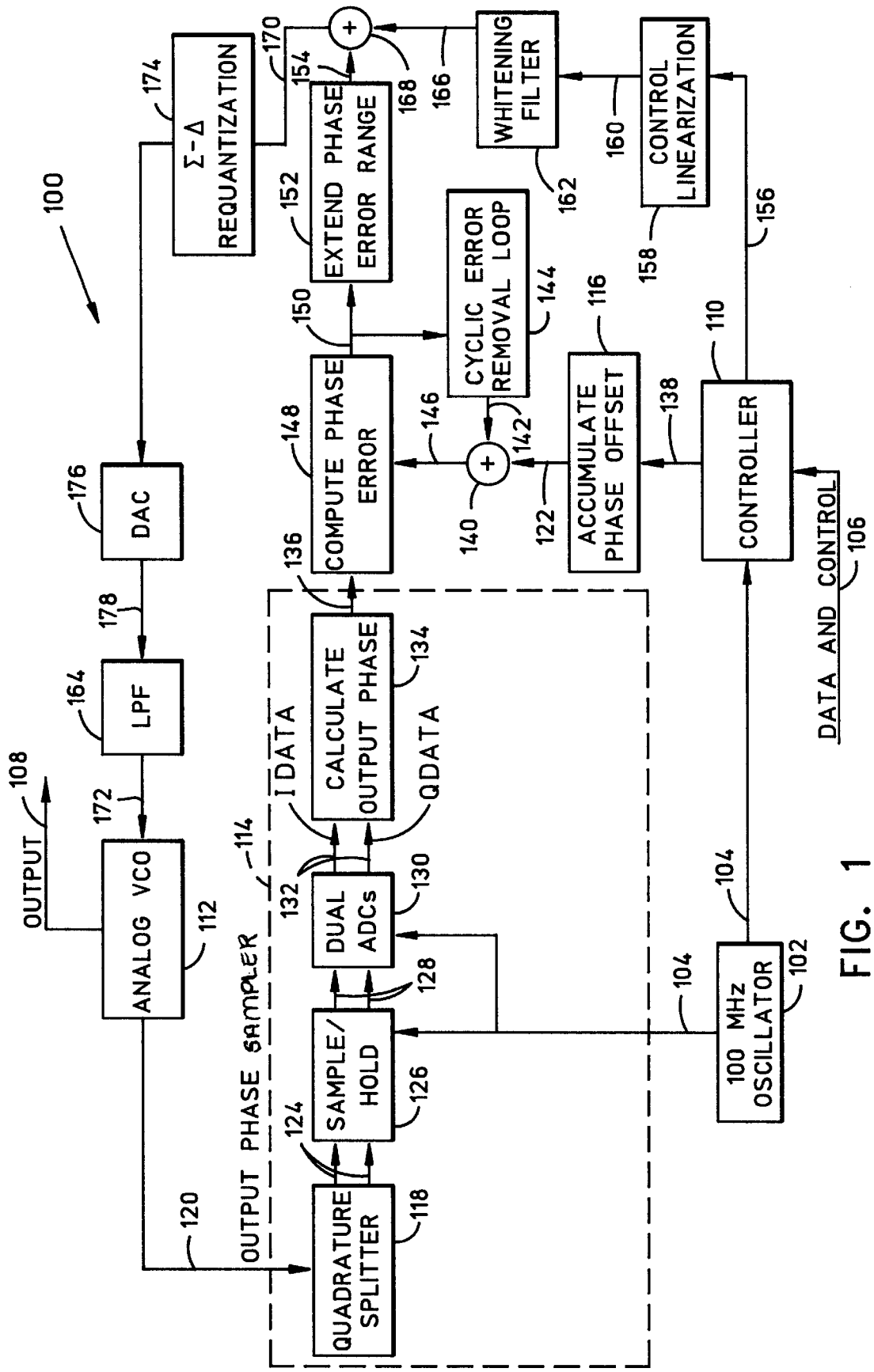
FIG. 1 illustrates a conceptual block diagram of the invention.

FIG. 1 provides a functional block diagram illustrating the concept of the fast frequency-hopping synthesizer and modulator 100 of this invention. The frequency values used in the following discussion are provided to clarify the explanation and, being merely illustrative, do not limit the scope of the invention claimed herein. Synthesizer 100 operates under the control of a clock oscillator 102, which generates a single-phase 100 MHz clock signal 104. Synthesizer 100 accepts a digital data and control input signal 106, which includes an input signal representing a desired output signal frequency and phase, and produces an analog output signal 108 having a phase and a frequency in the 2.5–3.5 GHZ band. The basic internal elements of synthesizer 100 include the controller 110, the analog-voltage-controlled oscillator (VCO) 112, the output phase sampler 114, and the numerically-controlled oscillator (NCO) accumulator 116. The remainder makes up the assembly of output phase error correcting loops discussed below.

For ease of description, output phase sampler 114 is shown in FIG. 1 as having the simple and preferred embodiment described in more detail herein below in conjunction with FIG. 5. The quadrature power splitter 118 accepts a portion of the 3.0 GHz synthesizer output signal power 108 at the sample signal line 120. Output signal 120 consists essentially of a single-frequency output signal component generated by analog voltage controlled oscillator (VCO) 112, which is phase-locked to a digital reference signal 122 from NCO accumulator 116 in the manner that is described at length herein below. Digital reference signal 122 represents the instantaneous phase of an alias of the desired output signal frequency specified by input signal 106 to controller 110, where the alias is disposed within the Nyquist sampling-limits of the 100 MHz clock frequency. Thus, digital reference signal 122 represents a desired output frequency alias within a 100 MHz reference frequency band within the ±50 MHz Nyquist-limited sampling band for the example frequencies recited here. If input signal 106 specifies a 3 GHz desired output frequency, then digital reference signal 122 specifies a desired phase for an alias frequency within the $30^{th}$ Nyquist band corresponding to a 100 MHZ reference frequency band centered at 3.0 GHz. This can be appreciated with reference to the discussion herein below in conjunction with FIGS. 2A–2C.

Quadrature splitter 118 generates a pair of output signals in quadrature on the lines 124. A dual sample-and-hold circuit 126 under-samples each of the pair of 3.0 GHz output signals 124 at 100 MHz (clock frequency 104) to generate a plurality of pairs of basebanded sampling-induced output signal aliases 128, one of which is in the ±50 MHz Nyquist-limited baseband region. This can be better appreciated with reference to the discussion below in conjunction with FIGS. 8B–8C. The lowest-frequency pair of sampling-induced baseband alias signal pairs 128, which is in the ±50 MHz Nyquist-limited baseband region, is the only useful such pair for the purposes of output phase sampler 114. Each of the plurality of baseband alias signal pairs 128 represents the product of output signal frequency 120 and a respective harmonic of the sampling clock frequency 104. Although only the lowest-frequency baseband alias pair 128 is useful at any particular instant, the particular harmonic of clock frequency 104 corresponding to the lowest-frequency baseband alias pair 128 changes repeatedly responsive to output signal modulation and hopping. Because each of the aliases are phase-continuous, as the output frequency changes, a particular baseband alias signal pair 128 used for error control can be smoothly replaced by the next with no loss of phase coherency.

An analog baseband alias signal pair 128 is received by the dual analog-to-digital converter (ADC) 130 under control of clock frequency 104 to produce the digital I and Q data signals at lines 132. It can be appreciated that digital I and Q data signals 132 contain information about the instantaneous phase of VCO output signal 108 with respect to clock frequency 104. Because clock frequency 104 also controls NCO accumulator 116, this phase information can be related to digital reference signal 122 in a straightforward manner, as discussed herein below. The instantaneous phase information represented by digital I and Q data signals 132 is extracted by an argument function 134 to produce the digital phase signal 136, which represents the sampled instantaneous output signal phase. The operation of argument function 134 can be better appreciated with reference to the discussion herein below in conjunction with FIGS. 3C and 11*a*.

Digital reference signal 122 is produced by NCO accumulator 116 responsive to the digital frequency signal 138 from controller 110. A digital adder 140 adds digital reference signal 122 to a digital cyclic error signal 142 from the cyclic error removal loop 144 to correct for any detectable effects of amplitude or phase imbalances in baseband I and Q digital data signals 132. Such cyclic errors can cause spurs in VCO output signal 108 at multiples of the NCO frequency that are proportional to the imbalances that exist. The imbalances can arise from RF power splitter imperfections (in quad splitter 118), delay differences in the I and Q paths, or imperfections in the A/D sampling hardware (e.g., dual ADC 130). The resulting phasor trajectory followed by digital I and Q data signals 132 is not circular but elliptical. Any ellipticity in the trajectory (crowding of certain phases in time) corresponds to an error relative to an equal increment that must be corrected to minimize spurs. These errors are cyclic, and can be distinct for each quantized value of phase. Cyclic error removal loop 144 provides a memory that is updated based on the detected error (at each phase) found after the loop settles. The necessary error correction depends on the imbalance variation over the hop range and is dynamically updated with actual loop error experience. The cyclic error correction loop of this invention is discussed in more detail herein below in conjunction with FIGS. 11*a*–11*b* and 12.

A corrected digital phase signal 146 from adder 140 is combined with digital phase signal 136 in the phase error computation network 148 to produce the digital loop error signal 150, which represents the instantaneous phase error detected in a sampling-induced alias of VCO output signal 108 with respect to the instantaneous phase of a desired output signal alias (represented by digital reference signal 122) in a Nyquist-limited reference band. Digital loop error signal 150 is accepted as an input by cyclic error removal loop 144, which produces digital cyclic error signal 142 based on actual experience over a number of clock cycles.

The phase detection and comparison process generates the phase difference (digital loop error signal 150) using fixed-point arithmetic so there is a limit to the error signal range. It is a linear representation of phase error up to the value of phase representing ±PI (representing the maximum/minimum binary value), after which the phase sign changes and ambiguities occur. The range of digital loop error signal 150 is extended by a roll-over counter circuit 152, which detects these rollovers and thereby increases the number of phase error bits (from 8 to 16 in one embodiment) to produce an extended phase error signal 154. In this manner, loop phase errors arising from a frequency error up to the ±50 MHz Nyquist reference frequency band limit can be tracked with the phase lock loop, thereby allowing a phase-continuous hop within a single clock cycle.

In addition to digital frequency signal 138, controller 110 produces a digital frequency signal 156 representing the instantaneous value of the desired output signal frequency specified by input signal 106. Digital frequency signal 156 is received by a feed-forward and linearization network 158, which operates as a secondary control loop to minimize the time required to hop from one frequency to another. Feed-forward and linearization network 158 produces a corrected feed-forward signal 160. Feed-forward and linearization network 158 also corrects for detectable nonlinearities in the tuning characteristics of VCO 112 by storing and dynamically updating a memory of the VCO tuning control signal value actually required for each hop frequency, which may deviate from the ideal VCO tuning characteristic. The updating process captures the error present in the phase-lock loop after transients die away; this error reflects nonlinearities in VCO tuning arising from temperature changes and similar sources. This capability allows both power-on and on-the-fly hardware self-calibration and may be better appreciated with reference to the discussion herein below in conjunction with FIGS. 13–15.

Corrected feed-forward signal 160 is received by the whitening filter 162 for pre-whitening (digital inverse filtering) to compensate for the later analog anti-alias filtering done by the low-pass filter 164. Whitening filter 162 is preferably a FIR filter with numerator roots in the z-transfer function that correspond to the denominator roots of analog low-pass filter 164. This speeds the modulation and hopping performance of the phase lock loop. Whitening filter 162 produces a feed-forward signal 166 that is added to extended phase error signal 154 by a digital adder 168 to produce the digital data signal 170 representing the VCO control signal 172 expected to produce the desired output signal at VCO output 108.

Because available 100 MHz digital-to-analog converters (DACs) do not offer sufficient bits for the desired synthesizer frequency precision, a sigma-delta requantizer 174 is applied to digital data signal 170 to extend the effective resolution of the DAC 176 by about four bits. DAC 176 converts digital data signal 170 to an analog control signal 178. Sigma-delta requantizer 174 randomly dithers available resolution in DAC 176, thereby providing an average desired resolution while spreading the remaining error energy and minimizing quantizing noise in the output.

Although quantizing noise is minimal in control signal 178, it is filtered by low-pass filter 164 to remove the alias outputs of DAC 176. This filtering also minimizes the energy from sigma-delta requantizer 174, which is concentrated near the Nyquist frequency. The delay caused by low-pass filter 164 is compensated by advancing the timing of feed-forward signal 160 relative to digital frequency signal 138 into NCO accumulator 116 and by the effect of whitening filter 162. This process adds latency in the synthesizer control loop but also implements the fastest possible hopping speed.

Thus, stated succinctly, once output signals 124 are undersampled by dual sample-and-hold circuit 126 and sampling-induced baseband alias signals 128 are quantized in dual ADC 130, then argument function 134, implemented as a look-up table (LUT) or other useful digital technique, is used to compute the quantized instantaneous phase of the complex rotating phasor represented by digital I and Q data signals 132. This complex phase information (digital phase signal 136) is used (in a digital phase-lock loop) to lock VCO 112 to reference signal 122 in the digital domain by converting digital data signal 170 into the analog control signal 172 to VCO 112. Subtracting NCO-generated reference alias phase from the VCO output signal alias phase represented by the complex rotating phasor at network 148 generates a difference signal 150 that is linearly proportional to the phase difference between the NCO alias of the desired VCO signal and the actual VCO alias signal. This loop error signal 150 is amplitude-adjusted and fed back to VCO 112, implementing a stable first-order control loop.

Figure 2A:
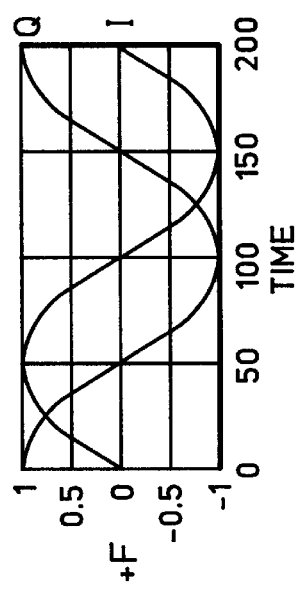
FIGS. 2A–2C illustrate the Nyquist-boundary hopping concept of the invention.
Figure 2B:
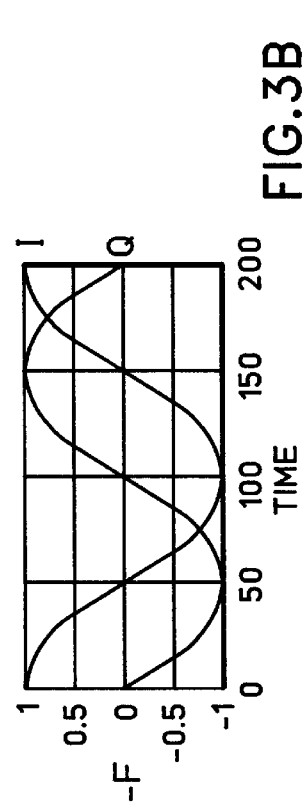

FIGS. 2A–2C and 3A–3C illustrate the Nyquist-boundary hopping concept of this invention. The frequency values in the following discussion are merely illustrative and do not limit the scope of the invention. FIG. 2A shows an illustrative frequency sweep of VCO output signal 108 (FIG. 1) from the 3.0 GHz center upward to 3.25 GHz. Because the Nyquist frequency of the 100 MHz sample rate available from clock 102 (FIG. 1) is only 50 MHz, frequency steps of up to 50 MHz can be tracked with the loop. FIG. 2B shows the ±50 MHz tuning range of NCO 128 (FIG. 1). However, for the example in FIG. 2A, this ±50 MHz tuning range about the VCO center frequency is not alone sufficient to span the 250 MHz hop.

Figure 2C:
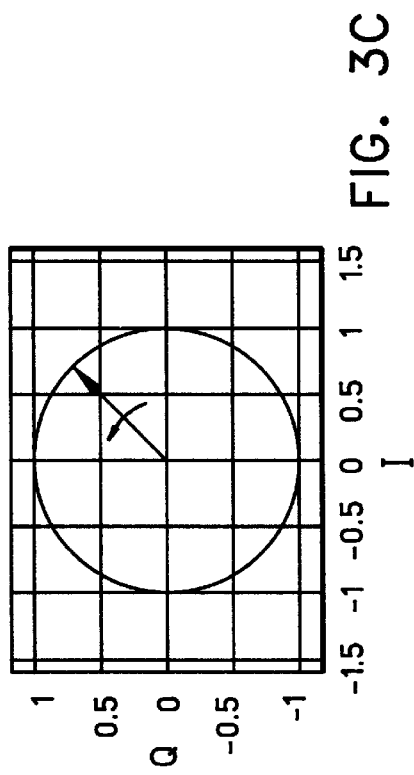

To implement the longer hop, FIG. 2B shows that NCO digital reference frequency 122 is first ramped up to the maximum (50 MHz) Nyquist frequency, and, in the next clock cycle at 202 in FIG. 2B, NCO frequency 122 steps to the appropriate frequency near the maximum negative of its range (−50 MHz). This occurs because digital frequency signal 138 into NCO accumulator 116 (FIG. 1) simply overflows or underflows at the extremes; but digital frequency signal 138 into NCO accumulator 116 merely steps phase-continuously to the other edge of the reference frequency band. Because of loop bandwidth limitations, VCO output signal 108 is driven higher in frequency and remains locked to the corresponding alias term generated by the output phase sampler sampling process. The alias then tracks NCO output 126 as it ramps positively through the negative frequencies and then the positive frequencies, and so forth. In this manner, VCO output signal 108 is ramped through the successive multiples of the Nyquist frequency shown in FIG. 2A, without losing phase-lock to the desired output phase represented by the NCO output, until the VCO frequency rises up to its specified limit. To allow this to occur, dual ADC 130 (FIG. 1) must provide a sufficiently small and precise time sampling aperture to properly capture the down-converted signal, which can be several times the Nyquist rate. A phase-continuous hop across the entire 2.5–3.5 GHz output frequency band (1000 MHz, equal to ten ±50 MHz Nyquist bands) can be completed, and the new output signal frequency stabilized, within 40 clock cycles according to the improvements of this invention. FIG. 2C shows the change in digital phase signal 136 (FIG. 1) in arbitrary units during the synthesizer sweep of FIG. 2A. The diagram in FIG. 2C includes the rollover accumulated as digital phase signal 136 repeatedly cycles through its ±PI range.

Figure 3A:
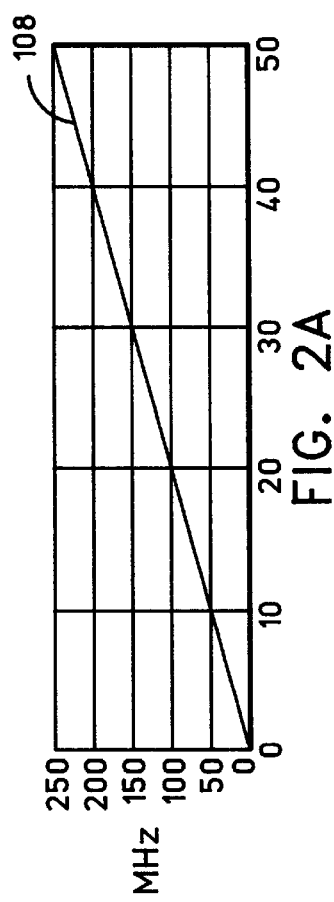
FIGS. 3A–3C illustrate the complex rotating phasor concept of the invention.
Figure 3B:
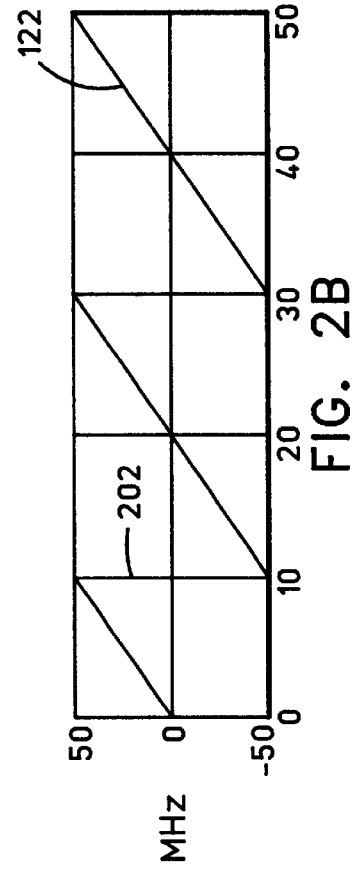
Figure 3C:
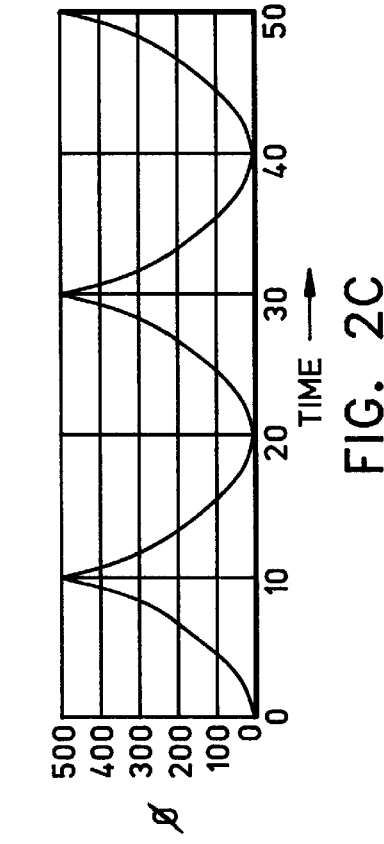

When digital reference signal 122 frequency is positive, digital I and Q data signals 132 (FIG. 1) are related as shown in FIG. 3A, with I leading Q. Similarly, when Q leads I as in FIG. 3B, digital phase signal 136 frequency is negative. FIG. 3C shows a phasor diagram demonstrating that the direction of phasor rotation corresponds to the sign of digital phase signal 136. The instantaneous phase of this phasor, when compared to the phase specified by digital reference signal 122, represents the phase error of VCO output signal 120, which is held to zero by the phase lock loop as discussed herein below.

The Complex Alias Phase Sampling Process

Figure 4:
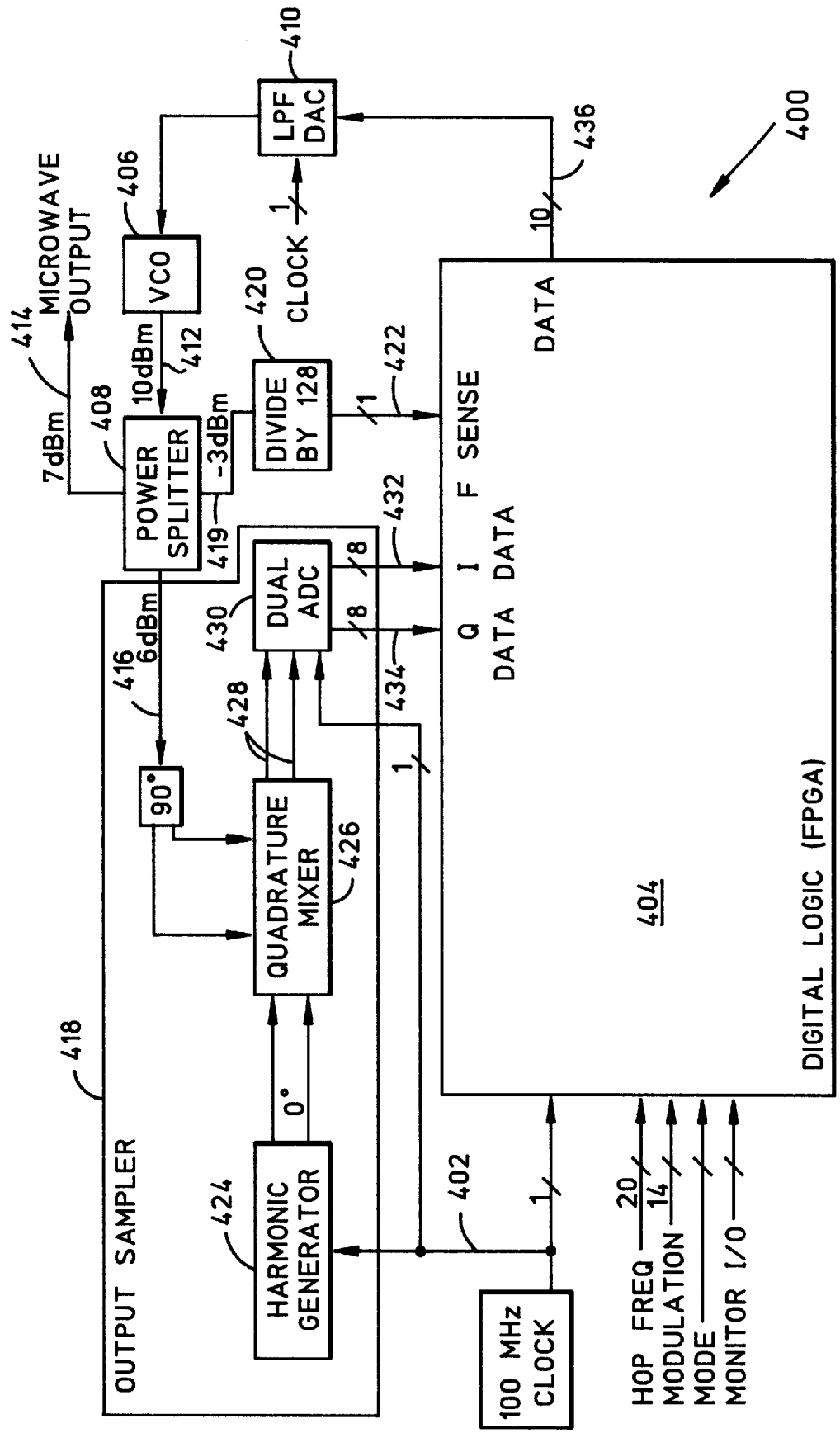
FIG. 4 illustrates a block diagram showing the basic analog elements of an illustrative embodiment of the fast frequency-hopping microwave synthesizer of the invention.

FIG. 4 provides block diagram showing the basic analog elements of an illustrative embodiment of the fast frequency-hopping microwave synthesizer 400 of this invention. Although functionally equivalent to the illustration of FIG. 1 discussed above, the various functional blocks are reorganized in FIG. 4 to emphasize the distinction between the relatively simple analog circuitry and the more extensive digital logic portions of synthesizer 400 and to illustrate another useful embodiment of the output phase sampler of this invention.

The main analog elements of the synthesizer are the VCO output function and the aliasing output phase sampler of this invention. Referring to FIG. 4, the 100 MHz clock signal 402 is used to synchronize all digital logic in the field-programmable gate array (FPGA) logic 404. The VCO output function is readily appreciated as including the VCO 406, the power splitter 408 and the low-pass filter (LPF) and digital-to-analog converter (DAC) assembly 410. Power splitter 408 accepts a 10 dBm analog microwave signal 412 from VCO 406 and distributes it without significant delay or distortion. The output signal 414 includes about 7 dBm of the original power, with most of the remaining 6 dBm split off as an output signal sample 416 for use by the output sampler 418 in the manner discussed herein below. A small −3 dBm fraction is split off as a frequency-sense signal 419 and sent to the frequency divider 420 to generate an F-sense input 422 to logic 404. F-sense input 422 is used by logic 404 at start-up to resolve the temporary ambiguity in the down-converter alias signals used to control the phase of output signal 414, which can be appreciated with reference to the detailed discussion herein below.

The output phase sampling function of the output phase sampler of this invention is readily appreciated as including the harmonic generator 424 and the quadrature mixer 426 within output sampler 418, which accepts clock signal 402 and output signal sample 416 and generates the pair of analog baseband alias signals 428, which are accepted by the dual analog-to-digital converter (ADC) 430 to produce the pair of 8-bit baseband alias signals I-data 432 and Q-data 434 for presentation to the remainder of the output phase sampler (not shown) in logic 404.

FPGA logic 404 operates to produce the 10-bit data signal 436 representing the phase-lock loop control signal that is converted to the analog domain and low-pass filtered to remove spurs at assembly 410 before presentation to VCO 406 to close the first-order loop.

Figure 6:
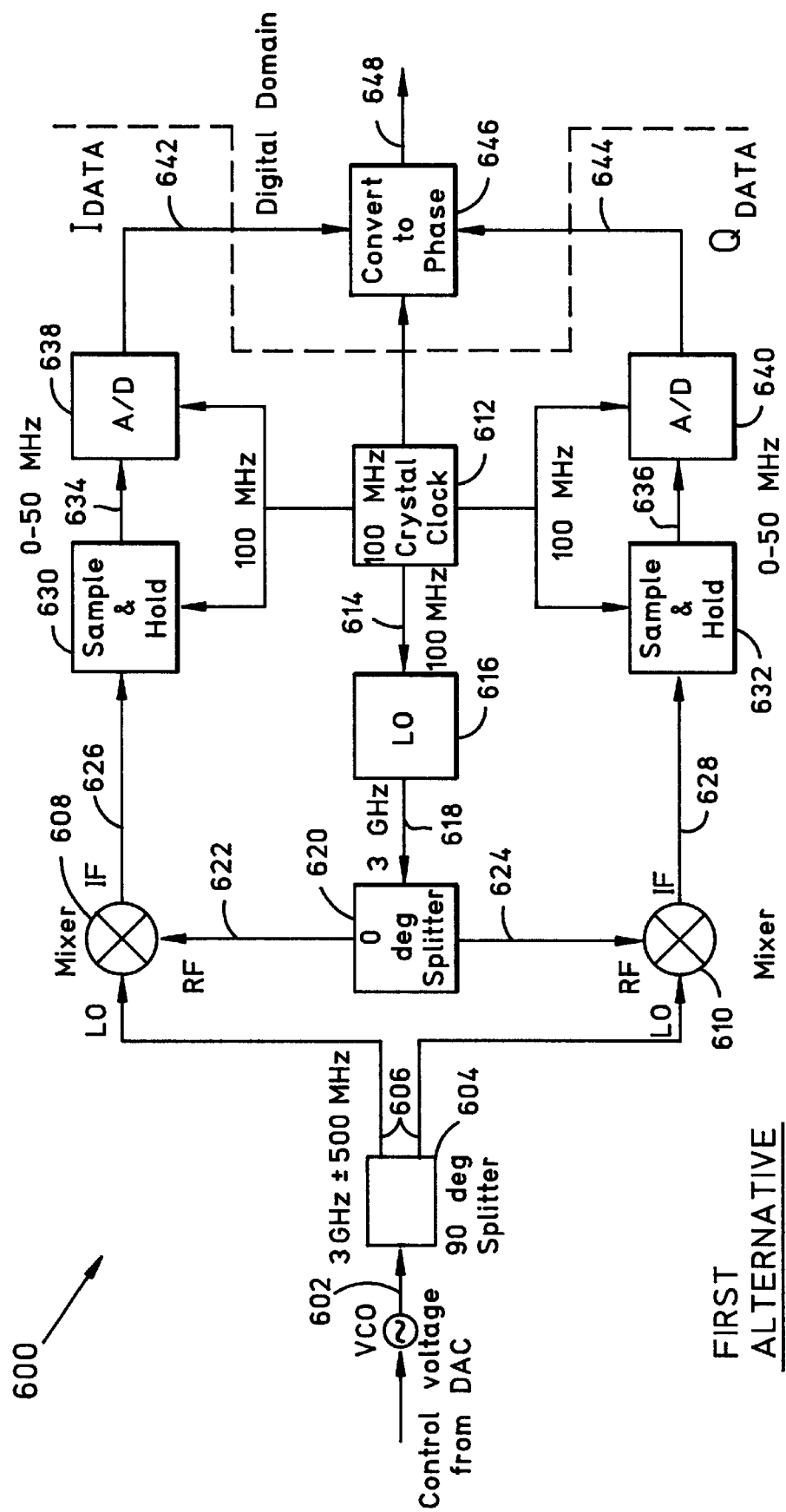
FIG. 6 illustrates a first alternative embodiment of the phase sampling process of the invention.
Figure 7:
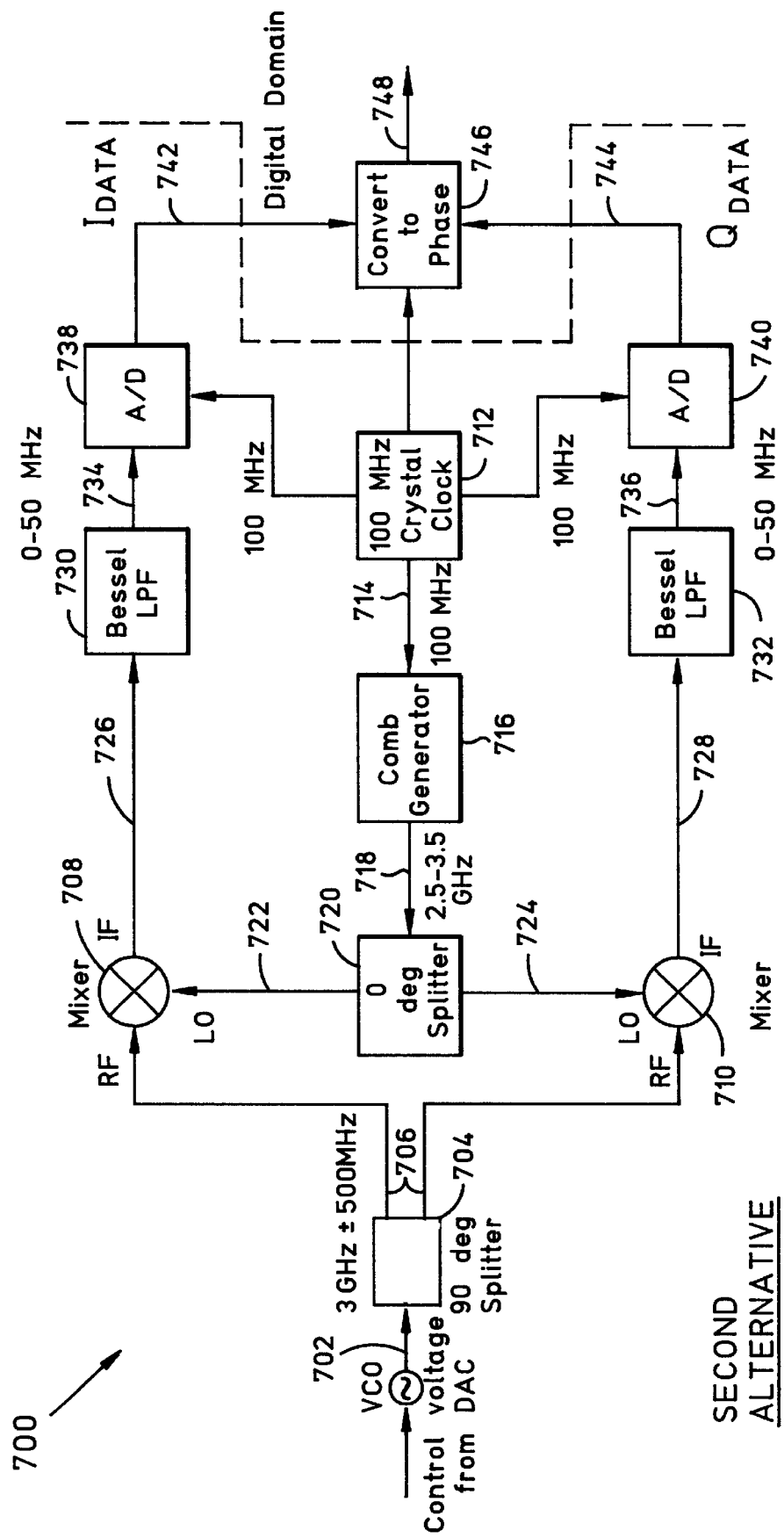
FIG. 7 illustrates a second alternative embodiment of the phase sampling process of the invention.

The inventors have considered several different embodiments of output sampler 418. The fundamental purposes of output sampler 418 is to create a sampling-induced alias of the output signal, whether by under-sampling or by down-conversion and mixing with clock harmonics or some other useful technique, and to digitize the instantaneous phase of a quadrature-pair of baseband aliases of VCO output signal 416 to produce a series of discrete-time instantaneous output-signal phase samples. Output sampler generates a plurality of output-signal aliases each carrying the desired instantaneous output phase information. These aliases permit the use of an inexpensive low-frequency sampling clock (100 MHz) to accurately sample a gigahertz output signal phase. FIGS. 5–7 disclose three different embodiments of the output phase sampler of this invention, with FIG. 5 providing the simplest preferred (but idealized) embodiment and FIGS. 6–7 showing two favored alternate embodiments.

Figure 5:
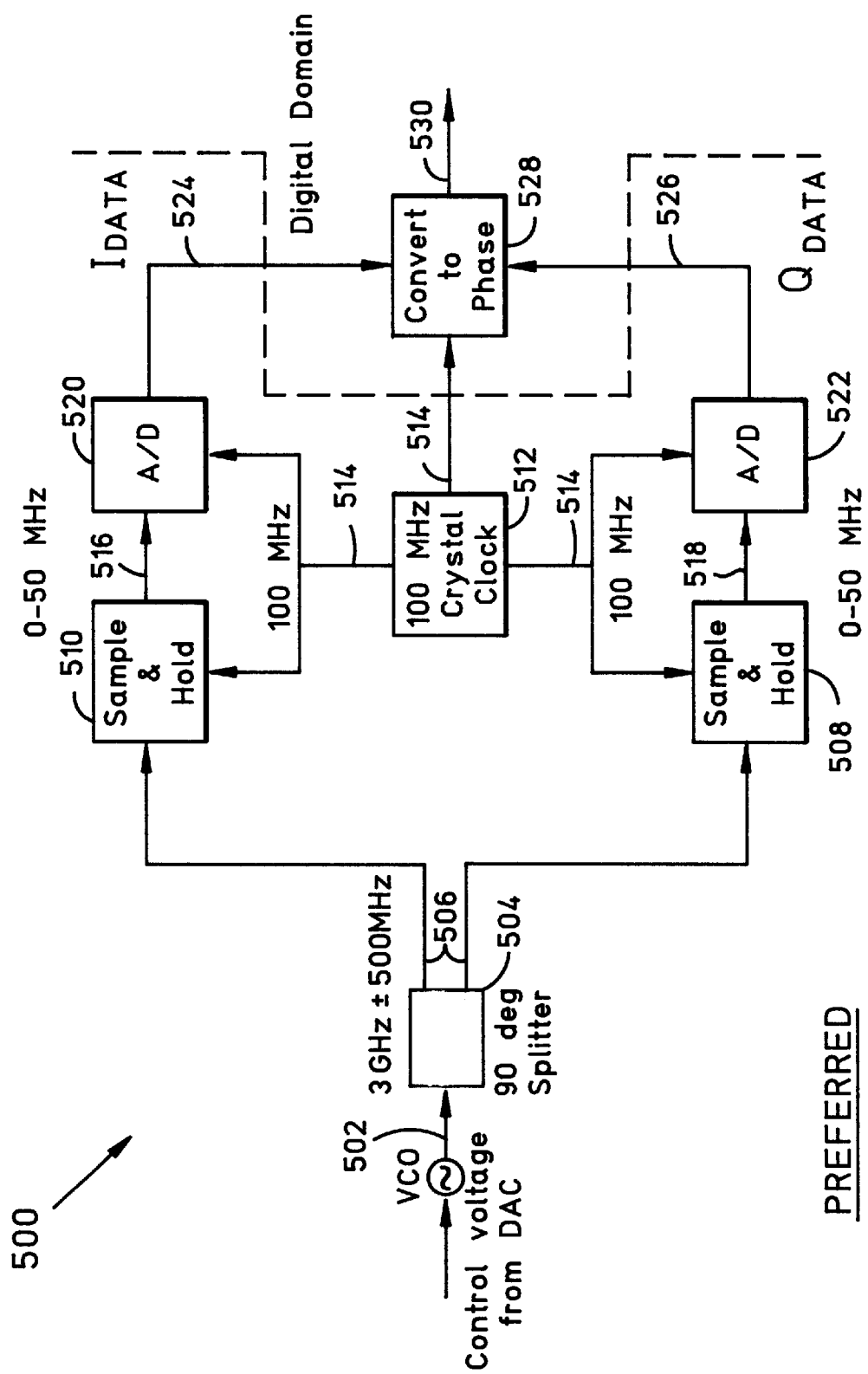
FIG. 5 illustrates an idealized embodiment of the phase sampling process of the invention.

FIG. 5 shows a schematic diagram of an output phase sampler 500, which is the simplest preferred (but idealized) embodiment discussed above in conjunction with FIG. 1. The VCO 3.0 GHz output signal sample 502 is received by a 90-degree power splitter 504 to produce an output signal pair 506, which is accepted by a dual sample-and-hold circuit shown as the sample & hold circuits 508 and 510. The 100 MHz clock circuit 512 produces a clock frequency 514. The operation of sample-and-hold circuits 510 and 512 is key to the method of this invention. Because the 3.0 GHz output signal pair 506 are under-sampled (by 100 MHz clock frequency 514), sample-and-hold circuits 510 and 512 produce a plurality phase-coherent aliases, one of which lies within the ±50 MHz Nyquist-limited baseband of interest. Although this is the preferred embodiment of the output phase sampler of this invention, it is relatively difficult to realize because of the very short sampling aperture (100 ps) required to obtain useful instantaneous phase information in the form of baseband alias signals. The resulting baseband alias signals 516 and 518 are respectively digitized by the two analog-to-digital converters (ADCs) 520 and 522 to produce the digital I-data and Q-data signals 524 and 526. These are accepted by the argument function 528 to produce the digital phase signal 530, which represents a series of digital instantaneous output signal phase samples.

Figure 9A:
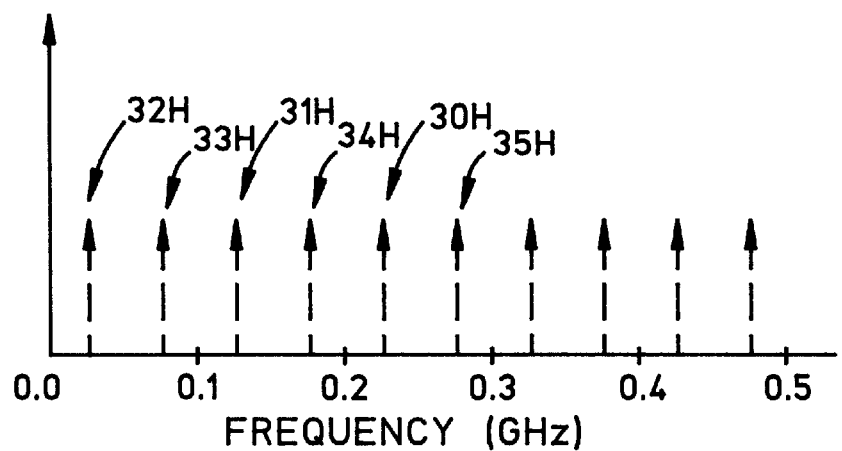
FIGS. 9A–9C illustrate the various baseband alias spectra related to the phase sampling processes of FIGS. 5–7.

For this example, FIG. 8A illustrates an exemplary 3.23 GHz frequency value of output signal 502 from FIG. 5. FIG. 9a shows the spectra of baseband alias signals 516 and 518 for the example. Note that the product of the $32^{nd}$ clock harmonic and output signal 502, shown as 32H, is the one that is digitized for use in the phase error loop. Careful study of FIG. 9a reveals that the alias lines 32H and 33H will move together and pass by each other as the output frequency slews upward from 3.23 GHz to 3.25 GHz and beyond. When lines 32H and 33H cross one another, the phase error loop will smoothly transition from $32^{nd}$ alias 32H to $33^{rd}$ alias 33H as line 33H drops below line 32H in baseband frequency. This transition is phase-continuous because both alias lines 32H and 33H have the same instantaneous output phase information, provided that the phase gate sampling interval is sufficiently brief.

FIG. 6 shows a schematic diagram of an output phase sampler 600, which is a preferred alternative to the idealized embodiment discussed above in conjunction with FIG. 5 because the requisite sampling interval of 5 ns is substantially longer than the 100 ps sampling gate necessary for proper operation of the idealized circuit in FIG. 5. The VCO output signal 602 is split in a 90-degree power splitter 604 to produce an output signal pair 606, which is presented to a dual mixer shown as the mixers 608 and 610. The clock circuit 612 produces a clock frequency 614, which is multiplied in a phase-locked loop local oscillator (LO) 616 to produce a LO signal 618 having a single frequency (e.g., 3000 MHz) in the middle of the output frequency band. The 0-degree splitter 620 splits LO signal 618 into a pair of local signal components 622 and 624, which are accepted by the two mixers 608 and 610. Dual mixer 608–610 produces a quadrature product signal pair 626 and 628 as shown. Quadrature product signals 626 and 628 are then individually under-sampled (by clock circuit 612) by the dual sample-and-hold (S/H) circuit 630 and 632 to produce a plurality of baseband alias signal pairs 634 and 636, which are digitized by the two analog-to-digital converters (ADCs) 638 and 640 to produce the digital I-data and Q-data signals 642 and 644, respectively. Digital I-data and Q-data signals 642 and 644 are accepted by the argument function 646 to produce a digital phase signal 648 representing a series of digital samples of instantaneous output signal phase.

The operation of S/H circuits 630 and 632 is also key to this alternative embodiment of this invention. S/H circuits 630 and 632 under-sample the ±500 MHz quadrature product signal pair 626 and 628 to produce phase-coherent aliases, one pair of which occurs within the ±50 MHz Nyquist-limited baseband of interest. The sample-and-hold aperture is about 5 ns for the output frequency range of ±500 MHz, which is less demanding than the 100 ps phase gate aperture required for output phase sampler embodiment 500 discussed above.

Figure 9B:
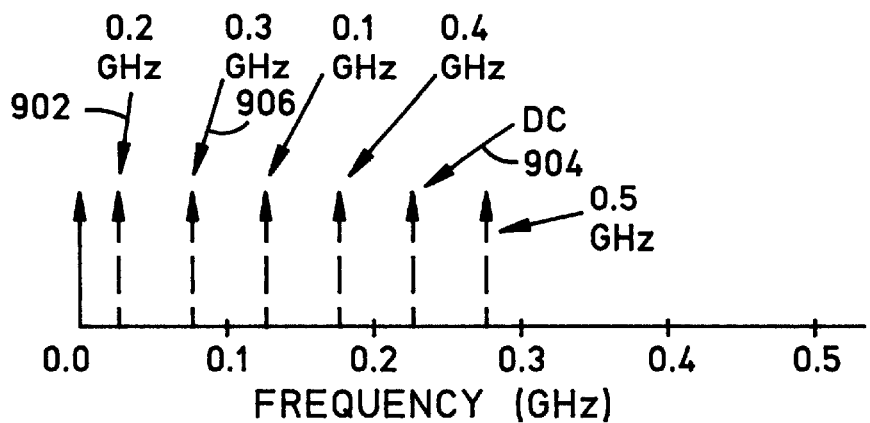

For this example, FIG. 8B illustrates the relationship between exemplary values of LO signal 618 and output signal 602. FIG. 8C shows the basebanded 230 MHz component found in each quadrature product signal 626 and 628 together with the basebanded 100 MHz (0.1 GHz) clock frequency lines produced by the operation of S/H circuits 630 and 632 (FIG. 6). FIG. 9B shows the spectra of baseband alias signals 634 and 636 for the same example. Note that the second alias 902 is the one that is digitized for use in the phase error loop and not the main signal 904. Careful study of FIG. 9B reveals that the second and third alias lines 902 and 906 will move together and pass by each other as the output frequency slews upward from 3.23 GHz to 3.25 GHz and beyond. When lines 902 and 906 cross one another, the phase error loop will smoothly transition from second alias 902 to third alias 906 as line 906 drops below line 902 in frequency. This transition is phase-continuous because both alias lines 902 and 906 have the same instantaneous output phase information.

FIG. 7 shows a schematic diagram of an output phase sampler 700 that is a useful alternative to the output phase sampler embodiments discussed above in conjunction with FIGS. 5–6 because no sample-and-hold circuits are necessary. The sampling-induced output signal aliases can be simulated using a combination of a comb harmonic generator and dual mixers, as now described.

The VCO output signal 702 is split in a 90-degree power splitter 704 to produce the output signal pair 706, which is accepted by the dual mixer 708 and 710. The clock circuit 712 produces a 100 MHz clock frequency 714, which is accepted by the harmonic comb (impulse) generator 716 to produce a plurality of clock harmonic components 718 spanning the 2.5–3.5 GHz output frequency band. The 0-degree splitter 720 splits clock harmonic components 718 into a pair of local signal components 722 and 724, which are accepted by dual mixer 708 and 710. Dual mixer 708–710 produces a pair of quadrature product signals 726 and 728 as shown, which are then low-pass filtered individually by the dual Bessel low-pass filter (LPF) circuits 730 and 732 to produce a pair of baseband alias signals 734 and 736. Baseband alias signal pair 734–736 are digitized by the dual analog-to-digital converter (ADC) to produce the digital I-data and Q-data signals 742 and 744, respectively. Digital I-data and Q-data signals 742–744 are accepted by the argument function 746 to produce the digital phase signal 748, which represents a series of digital samples of the instantaneous output signal phase.

Figure 9C:
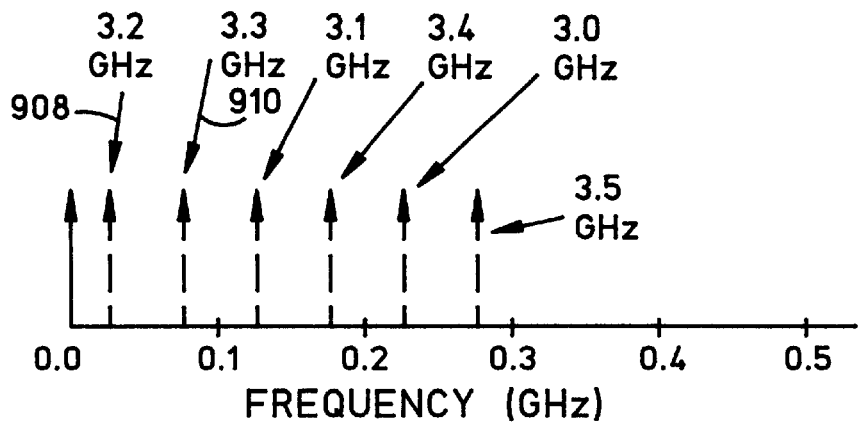

For this example, FIG. 8D shows the 3.23 GHz output signal 702 component found in each output signal pair 706 and the several in-band clock frequency harmonics present in each of local signals 722 and 724. FIG. 9C shows the spectra of baseband alias signals 726 and 728 for the same example. Note that the second alias 908 is the one that is digitized for use in the phase error loop because it has the lowest baseband frequency. As with FIGS. 9A–9B discussed above, careful study of FIG. 9C reveals that the second and third alias lines 908 and 910 will move together and pass by each other as the output frequency slews upward from 3.23 GHz to 3.25 GHz and beyond. When lines 908 and 910 cross one another, the phase error loop will smoothly transition from second alias 908 to third alias 910 as line 910 drops below line 908 in frequency. This transition is phase-continuous because both alias lines 908 and 910 have the same instantaneous output phase information.

Elements of the Digital FPGA Logic

Figure 10A:
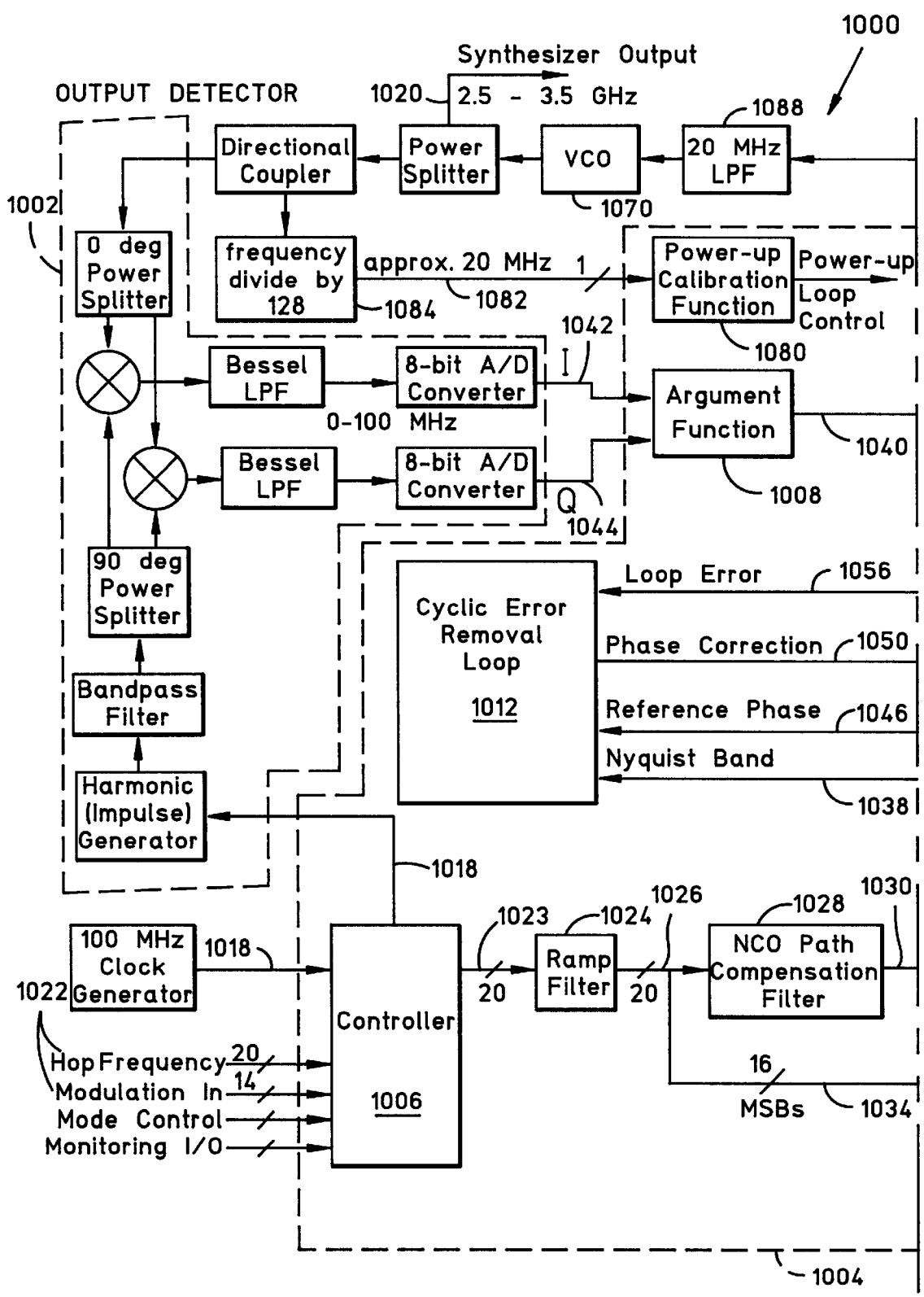

FIG. 10, comprising FIGS. 10A–10B, provides a block diagram showing the basic digital elements of an illustrative embodiment of the fast frequency-hopping microwave synthesizer of this invention. The synthesizer 1000 includes the output phase sampler 1002 and other analog elements described above in conjunction with FIG. 4. The FPGA logic 1004 is shown in some detail and includes a controller 1006, an argument function 1008 for phase conversion, a numerically-controlled oscillator (NCO) accumulator 1010, a cyclic error removal loop 1012, a VCO control linearization loop 1014, a Sigma-Delta requantizer 1016 and various other supporting elements discussed herein below. The fundamental purposes of these elements are introduced above in conjunction with FIG. 1.

Controller 1006 accepts the clock frequency 1018 for redistribution (not shown) throughout the remaining digital elements. The frequency and phase of the synthesizer output signal 1020 is controlled by means of a 34-bit digital input signal 1022 presented to controller 1006. A 20-bit portion of input signal 1022 specifies the desired output signal frequency and the remaining 14-bit portion specifies modulation. Controller 1006 produces a 20-bit output frequency word 1023 responsive to the 34-bit input signal 1022. Frequency word 1023 is digitally filtered in a ramp filter 1024 to produce a 20-bit filtered frequency word 1026, which is again digitally filtered in an NCO path compensation filter 1028 after which the 20-bit delayed frequency word 1030 is stored in a first-in-first-out (FIFO) register 1032. These delays are selected to compensate for other digital delays in the several feedback loops.

The 20-bit frequency word is specified to span the output frequency band. For instance, if the output frequency band is 3.5–4.5 GHz, the 20-bit word is specified to span the 1000 MHz bandwidth, providing a frequency resolution of no better than 1 kHz. The NCO accumulator 1010 operates over a reference bandwidth substantially less then the output bandwidth; in the example, the reference bandwidth is limited to plus-or-minus the Nyquist sample limit, or ±50 MHz for the 100 MHz clock frequency considered. Accordingly, only 16-bits of frequency word 1026 are needed to span the reference frequency band. These 16-MSBs 1034 are split off from frequency word 1026 and presented to VCO control linearization loop 1014 for use in the feed-forward function discussed herein below. Similarly, the 16-LSBs 1036 are split from delayed frequency word 1030 by FIFO register 1032 and received by NCO accumulator 1010. The remaining 4-MSBs 1038 are received by cyclic error removal loop 1012 for use in the dynamic error prediction function discussed herein below. MSBs 1038 represent the "Nyquist band" within which the reference frequency is instantaneously positioned. As the reference frequency slews across the reference band and overflows or underflows to the other edge of the reference frequency band (see the discussion above in conjunction with FIG. 2B), the value of the Nyquist band counter increments or decrements accordingly, as represented by MSBs 1038.

Argument function 1008 is implemented as a simple look-up table (LUT) containing the 8-bit values of the argument function, thereby producing a stream of 8-bit digital phase words 1040 representing the instantaneous value of a complex phasor represented by the 8-bit I-data and Q-data words 1042 and 1044. NCO accumulator 1010 produces an 8-bit digital phase reference word 1046 that represents the instantaneous phase of an alias of the desired output signal. The reference frequency represented by phase reference word 1046 ranges from one end to the other of the reference frequency band , herein also denominated the "Nyquist band." As an example, if the desired output frequency is 3.23 GHz and the clock frequency is 100 MHz, then each of the ±50 MHz Nyquist bands spans a reference bandwidth of 100 MHz. Thus, the first Nyquist band spans −50 MHz to +50 MHz, the second Nyquist band spans +50 MHz to +150 MHz, and so forth for as much as required to span the 2.5–3.5 GHz output frequency band. So the reference frequency represented by phase reference word 1046 spans only the 100 MHz reference band and therefore is said to represent an alias of the desired output frequency, which is actually equivalent to the reference frequency plus an additional integral number of 100 MHz Nyquist bandwidths represented by MSBs 1038.

The digital adder 1048 accepts the phase reference word 1046 and adds a cyclic error correction word 1050 from cyclic error removal loop 1012 to produce the corrected digital phase signal 1052. Corrected digital phase signal 1052 includes the estimated cyclic error and the desired phase of the reference alias. Digital phase signal 1040 includes the actual output phase of the sampling-induced alias corresponding to the reference alias as well as the two unwanted cyclic error and VCO control linearity error terms that motivate the inclusion of the two secondary error removal loops 1012 and 1014. When digital phase signal 1040 is subtracted from corrected digital phase signal 1052 by the digital adder 1054, the resulting 8-bit digital loop error signal 1056 represents only the loop phase error together with the remaining VCO control linearity error, which is immediately accepted by cyclic error removal loop 1012 for use in updating the estimated cyclic error correction. Because digital loop error signal 1056 is limited to ±PI, the rollover counter 1058 accepts digital loop error signal 1056 and captures any rollovers to produce a 16-bit extended phase error word 1060, which can span a phase range sufficient to sweep across the entire Nyquist reference band.

To avoid interactions noted between the two secondary error correction loops 1012 and 1014, cyclic error correction word 1050 is scaled up to 16-bits by the scaling register 1062 and subtracted by the digital adder 1064 from extended phase error word 1060. Because a frequency error is also recognized by cyclic error removal loop 1012 as a static phase error that is independent of absolute phase, any frequency error (such as an error arising from VCO control nonlinearity) causes cyclic error removal loop 1012 to attempt correction by accumulating the "static" phase error (adjusting equally the cyclic error correction values) for every position in the phase error look-up table (LUT). Thus, to ensure that a frequency error is detected and corrected by the proper loop, that is, by the VCO control linearization loop 1014, the phase error adjustment represented by cyclic error correction word 1050 that was added to phase reference word 1046 during the formation of extended phase error word 1060 is removed from extended phase error word 1060 to create the reconstituted loop error word 1066 before the embedded error information is accepted by VCO control linearization loop 1014.

One purpose of the VCO control linearization loop is to adjust for unintended variations in the slope of the frequency vs. DC input voltage characteristic of the VCO 1070. Depending on the frequency operating point of VCO 1070, the characteristic slope may change so that proper correction requires an adjustment to the phase-lock loop gain. This is provided for in the illustrative embodiment by sending a frequency sensitivity signal 1071 representing the change in detected VCO control linearity error as a function of frequency change. The necessary loop gain change required to adjust for the detected change in VCO characteristic slope is computed by the calculator 1072, which produces a loop gain compensation signal 1074 accepted by the loop gain adjuster 1076. By combining extended phase error word 1060 and loop gain compensation signal 1074, loop gain adjuster 1076 produces substantially as shown.

A second purpose of VCO control linearization loop 1014 is to provide an absolute correction to the 16-bit adjusted phase error signal 1078 as a function of desired output frequency. This is implemented by dynamic adjustment of the appropriate digital control signal values stored in a LUT in response to extended phase error word 1060 and the reference frequency represented by 16-MSBs 1034, which can be better appreciated with reference to the discussion herein below in conjunction with FIGS. 14–15.

During continuous operation, synthesizer 1000 regulates the phase of output signal 1020 by comparing the instantaneous phase of a measured alias with a digital reference signal representing the desired phase of an equivalent alias signal. As the output frequency is hopped many tens of thousands of time per second, all transitions between one alias component and another occur phase-continuously so there is no ambiguity problem. However, at startup, controller 1006 and NCO accumulator 1010 have no information regarding the Nyquist band that should be selected to properly regulate the output frequency. To resolve such startup ambiguities, the power-up calibration function 1080 accepts a simple output signal sub-harmonic 1082 from a divide-by-128 counter 1084. With this quick look at the output, the digital control loops can be properly synchronized in any of several fashions that are apparent to skilled practitioners in view of these teachings.

The whitening filter 1086 is a FIR filter designed to pre-compensate for the effects of the analog low-pass filter 1088, as discussed above. Whitening filter 1086 produces the 16-bit feed-forward signal 1090 to which the digital adder 1092 adds pseudo-random noise (PRN) to produce the dithered feed-forward signal 1094, which is combined with adjusted phase error signal 1078 by the digital adder 1096 to produce the digital data signal 1098 representing the analog control signal required by VCO 1070. Because the available digital-to analog converters (DACs) do not offer sufficient conversion linearity to justify a full 16-bit input word, digital data signal 1098 is passed through a Sigma-Delta requantizer 1016 to spread the quantization error arising from a 10-bit word size to produce the 10-bit digital data signal 1099, thereby minimizing the quantization error power at any particular frequency.

The Cyclic Error Removal Loop

The cyclic error removal loop is a relatively fast interior loop for accumulating and storing an estimate of the cyclic error seen in the I and Q phasors from the output phase sampler. The stored cyclic error is then used to pre-distort the reference phase signal from the NCO so that the incoming cyclic error is canceled upon comparison of the incoming phase signal with the reference phase signal. The desired phase signal from the NCO accumulator is subtracted from the sampled VCO phase signal to leave a zero difference when these rotating phasors are aligned by the phase-locked loop. To generate a VCO output signal free of cyclic errors, the incrementing phase from the NCO accumulator is augmented with an estimate of the cyclic error to give it the same characteristics present in the distorted VCO output sampled phase. Independent sets of look-up table (LUT) locations are provided for sub-bands of the output frequency range to accommodate errors that change with output frequency. The cyclic error removal process of this invention is self-calibrating.

As discussed above in conjunction with FIGS. 1 and 10, the digital FFH synthesizer embodiments of this invention use a microwave VCO to generate the output signal. In one such embodiment, the VCO is controlled by feeding back a portion of the output to the digital signal processing (DSP) circuitry using a set of power dividers, mixers, a fixed-frequency synthesized local oscillator (LO), and analog-to-digital (A/D) converters. The low-cost components preferred for this system are prone to variations in amplitude and phase as a function of frequency. The output signal is mixed with the fixed-frequency synthesizer to generate a quadrature baseband alias representation of the output signal, which is passed through a power splitter. The fixed-frequency LO is also split with a hybrid power divider. The result of component imperfections is that the phasor formed by the I-data and Q-data signals out of the ADCs describes an elliptical path instead of the idealized circle. This is illustrated by the diagram shown in FIG. 11A.

Figure 11A:
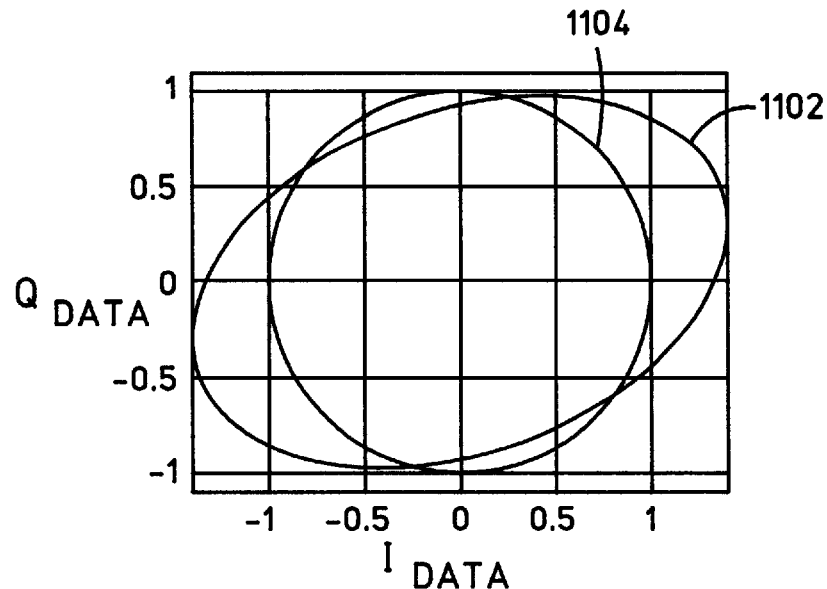
FIGS. 11A–11B illustrate the cyclic error correction concept of the invention.
Figure 11B:
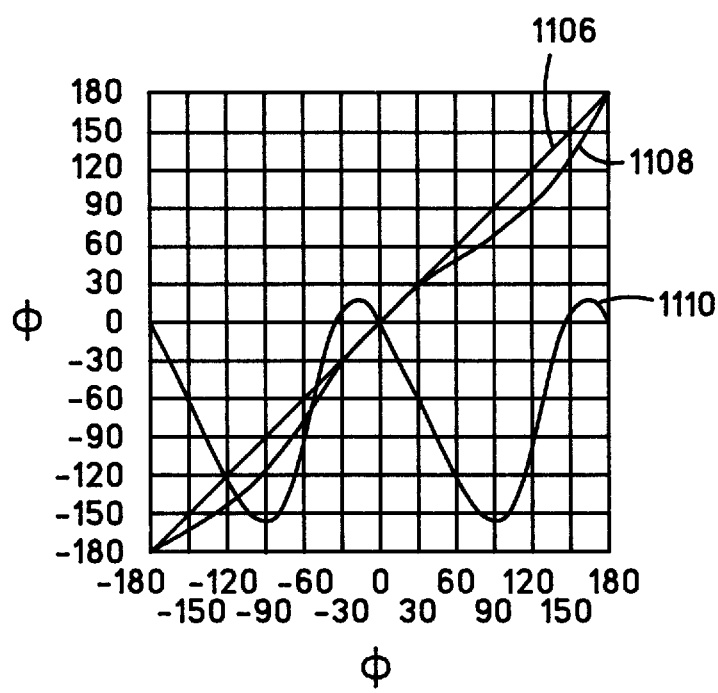

Referring to FIG. 11A, the line 1102 provides a view of the ellipticity of this function for the worst-case imbalances calculated by the inventors for readily-available components. The line 1104 provides an idealized circle for reference. As is clearly evident, this is a drastic distortion of the ideal phasor. The phase of this waveform is computed by the argument function as a four-quadrant inverse tangent of the phasor defined by the I and Q data samples. FIG. 11B shows the ideal phase characteristic 1106 expected from the ideal phasor path 1104, as a function of phase angle in degrees, the distorted phase characteristic 1108 computed from the worst-case amplitude and phase imbalances estimated by the inventors, and the resulting cyclic error 1110. Cyclic error 1110 imposes significant effects on the spectrum of the VCO output signal, which are manifested as phase-modulation of the VCO output signal, creating spurious products at odd harmonics of the desired frequency. This cyclic error is preferably removed by pre-distorting the desired reference phasor before comparison with the sampled phasor, as discussed above in connection with FIG. 10 and again below in conjunction with FIG. 12.

Figure 12:
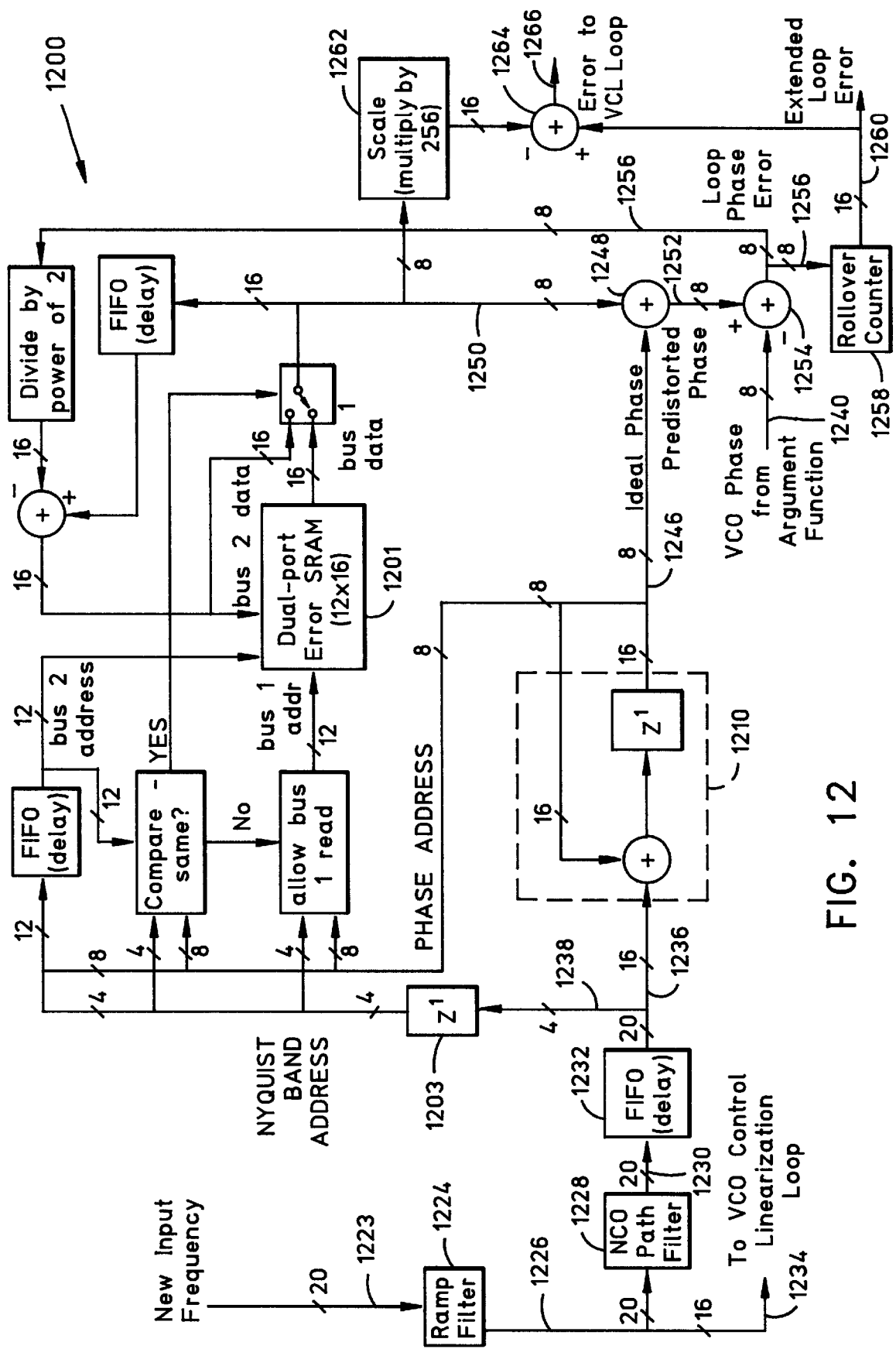
FIG. 12 illustrates a block diagram showing an illustrative embodiment of the cyclic error removal loop of the invention.

FIG. 12 illustrates a useful embodiment of the cyclic error removal loop 1200 of this invention. In FIG. 12, the various components are assigned numerals keyed to the numerals used in FIG. 10 discussed above. For example, ramp filter 1024 (FIG. 10) is the same element as the ramp filter 1224 in FIG. 12. Thus, it can be readily appreciated with reference to the above discussion in conjunction with FIG. 10 that cyclic error removal loop 1200 accepts the 8-bit digital loop error signal 1256 and the 8-bit digital phase reference word 1246 and responsively produces a cyclic error correction word 1250 representing an estimate of the pre-distortion needed to match the actual distortion present on the 8-bit digital phase signal 1240. The Nyquist band signal 1238 (the 4-MSBs of the 20-bit delayed frequency word 1230) is also accepted by cyclic error removal loop 1200 to permit error detection and removal to proceed as a function of the several different Nyquist-limited alias bands important to the method of this invention. As described above for FIG. 10, FIG. 12 shows that ramp filter 1224 accepts a 20-bit output frequency word 1223 and produces a 20-bit filtered frequency word 1226, the 16-MSBs of which are split off to form the digital frequency signal to the VCO control linearization loop (not shown). The NCO path compensation filter 1228 and the FIFO delay line 1232 add path delay needed for proper loop operation. The 16-LSBs are split from 20-bit delayed frequency word 1230 to produce the digital frequency signal accepted by the NCO accumulator 1210. The digital adder 1248 combines the 8-bit digital phase reference word 1246 with the estimated cyclic error correction word 1250 from the dual-port random-access memory (RAM) 1201 to produce a corrected digital phase signal 1252. When corrected digital phase signal 1252 is combined with digital phase signal 1240 at the digital adder 1254, the resulting 8-bit digital loop error signal represents only the measured output alias phase together with whatever remains of the cyclic error component after cancellation by the estimate therefor from RAM 1201. The rollover counter 1258 counts and stores phase cycle rollovers detected in 8-bit digital loop error word 1256 to produce the 16-bit extended phase error word 1260. Finally, cyclic error correction word 1250 is scaled to 16-bits by the scaling register 1262 so that it can be subtracted from 16-bit extended phase error word 1260 by the digital adder 1264 to produce the reconstituted loop error signal 1266 needed for the VCO control linearization loop. This last step is needed to allow the slower VCO control linearization loop to evaluate the actual output phase signal (with its imperfections) because the faster cyclic error removal loop sees the steady-state portion of the VCO control linearity error as a fixed phase error and attempts to correct it (by accumulating a fixed error component throughout the LUT) together with the mare variable cyclic error. Adding the phase error information back for consideration by the VCO control linearization loop permits it to process all components of the VCO control linearity error for which it is responsible.

The remaining elements shown in FIG. 12 can be appreciated by those skilled in the art to represent the read-write contention logic and address logic needed for using dual-port memory 1201 to store and dynamically update detected cyclic error values while simultaneously producing such values for use in correcting cyclic errors in synthesizer 1000 (FIG. 10). For instance, Nyquist band signal 1238 is stored in the Nyquist band register 1203 to address separate memory locations for each contiguous 100 MHz frequency band comprising a Nyquist band. The radio-frequency (RF) imbalances may vary sufficiently from band to band so that separate error correction measurements must be applied to each band. Each of the (12×16) memory array locations in RAM 1201 contains a stored value that represents the error for one of the many independent phase-locked loops making up the cyclic error removal system of this invention. Each phase-locked loop is intended to correct either one or several contiguous phases over time. The sampling rate seen by each of the phase-locked loops is slower than that seen by the I and Q phasors by the ratio of the number of samples that visits the phase (or group of phases) to the total number of samples. Each time that phase or group of phases is visited, a portion of the error is fed back and added to the value stored in the corresponding array location in memory 1201. In a frequency-hopped system, a pseudo-random pattern of frequencies is programmed to occur over time, so it is reasonable to assume that a uniform probability exists for visiting any given phase. Over a period of time, the effective sample rate should be a constant equal to the inverse of the number of phase error memory locations times the system sample rate. Thus, the "raw" sampling rate associated with each phase state, with one memory location per phase, is $2^{-8}$ times the system sampling rate, which corresponds to about 400,000 samples per second for a 100 MHz clock rate.

If more than one phase value is assigned to each memory element of the array in memory 1201, the sample rate is correspondingly increased. As a useful alternative to the preferred embodiment, the error array may be reduced by a factor of four so that only 64 memory locations are needed to service 256 phase values. This requires M=6 bits of memory address per frequency band for phase correction, which corresponds to an effective sample rate for the dynamic cyclic error correction process of about 1.5625M samples per second.

The number of bits needed for computation in the feedback part of the loop is a function of the power of 2 by which the error is divided. The phase states require 8 bits, and the division requires the same number of bits as the power of 2 used. A margin is provided to prevent overflow during the addition of this fed back error with the error already stored in memory. Typically, the number of bits for computation is at least the number of bits of phase (8) plus the divider power of 2 plus 4. Ultimately, the performance of loop 1200 depends on the number of memory locations in dual-port RAM 1201. It also depends on the amplitude and phase imbalances of the RF/analog circuitry within the phase locked loop before conversion into the digital domain. Quantization of the errors does not significantly affect the amplitude of the initial error spurious signals but reduction of the number of memory locations in RAM 1201 can increase quantization effects.

The dynamic cyclic error correction scheme of this invention is degraded by the control transients experienced during a frequency hop. Although the errors arising during these hops tend to have equal but opposite effects in the positive and negative directions, and these effects tend to cancel out over the long term, the system of this invention blanks the error signals during the early clock cycles (through the first forty clocks) following a hop command to avoid skewing the LUT entries with the transient errors.

The VCO Control Linearization Loop

The method of this invention for performing VCO control linearization uses a look-up table (LUT) to map from the desired output frequency to the digital-to-analog convertor (DAC) input word known to best produce the desired output frequency. This method compensates for both VCO and DAC nonlinearities. The LUT is self-calibrating because the actual VCO output phase error is observed at each output frequency visited and used to update the LUT entry for that output frequency. This provides a second-order loop characteristic, driving the static VCO/DAC phase error to zero, and calibrates the feed-forward function as well.

Available microwave VCOs today exhibit nonlinearities in the control voltage versus frequency characteristic. Although most of reasonable quality are monotonic, the sensitivity varies over the output frequency band and may also shift somewhat with temperature. The VCO output frequency for a given tuning control voltage varies with temperature. Accordingly, the preferred embodiment of the synthesizer of this invention employs the VCO control linearization loop that is now described.

The method of this invention for correcting the VCO/DAC control characteristics, and for correcting for VCO variations with changes in temperature, involves storing corrected measurements of the VCO control signal in a memory lookup table (LUT) for successive retrieval. The VCO is set to dwell at a given frequency and the error is determined relative to the desired frequency for that control voltage. This error is determined in the phase-locked loop and a portion of the error is added to the value already stored in a corresponding memory location. This method eventually and dynamically forces the VCO control linearity error to zero for the frequency visited. The VCO control linearization loop need not be particularly fast because the VCO/DAC control characteristics vary slowly with temperature changes. The correction occurs dynamically and results in a mapping of the linearly-stepped values of desired output frequency to the digital words representing the actual incremental analog voltage levels required (non-linearly stepped). The primary phase locked loop provides sufficient loop gain to drive the VCO to the correct output frequency value before completing the LUT correction process. The primary phase-locked loop has a "first-order" or "proportional" characteristic that drives the loop error to a fixed value quickly, and the VCO control linearization function adds a "second-order" or "integral" effect by means of the LUT correction process that is implemented over time.

Figure 13:
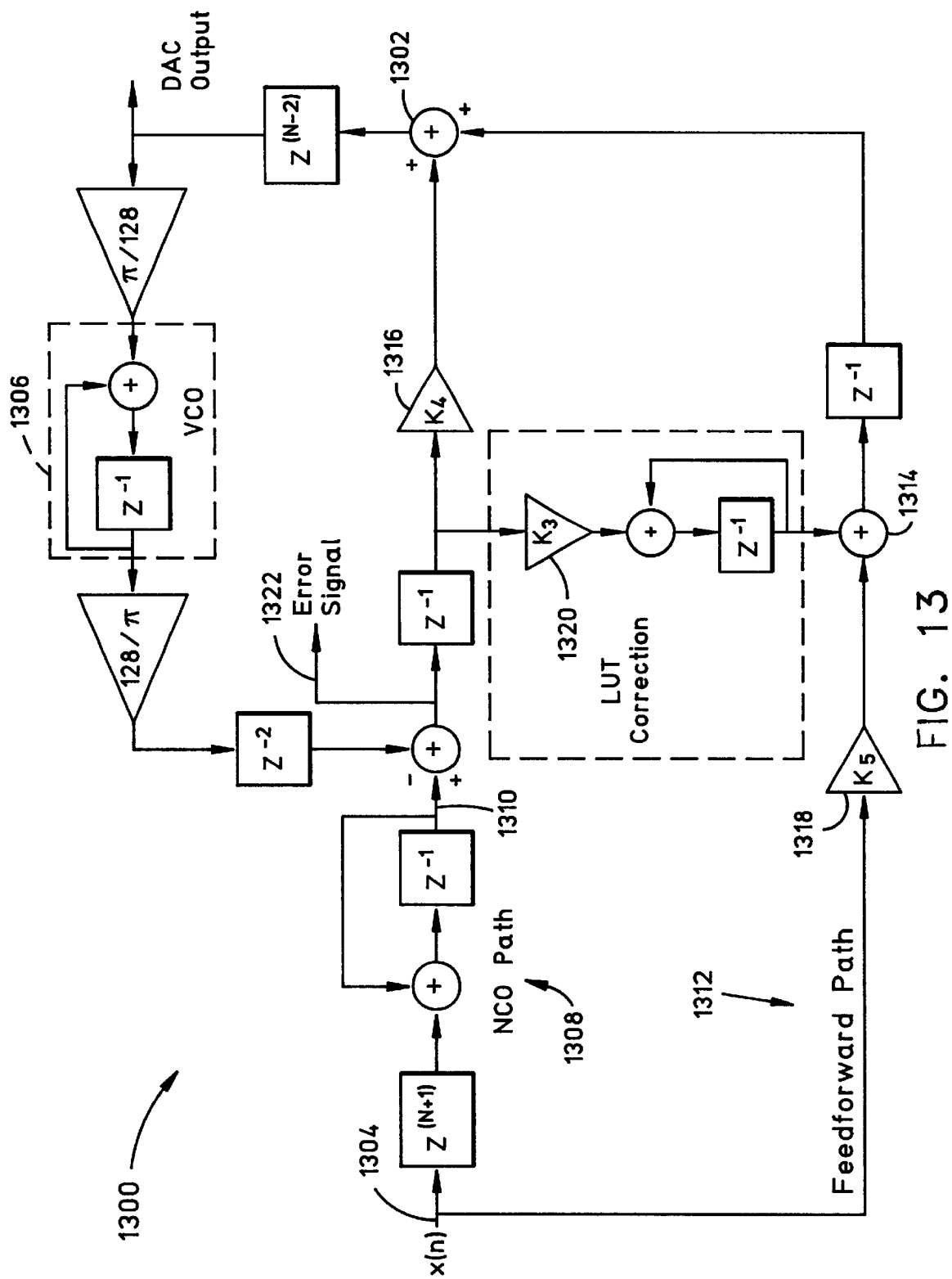
FIG. 13 illustrates a z-domain circuit model diagram demonstrating the method of the voltage-controlled oscillator (VCO) control linearization concept of the invention

FIG. 13 illustrates the z-domain circuit model diagram 1300 for the VCO control linearization method of this invention and will be readily appreciated by practitioners skilled in the digital control circuit art. The transfer functions are considered for a general delay allocation of N cycles, where N is the portion of the overall forward delay between the feed-forward summation point 1302 and the NCO loop input 1304 excluding the VCO integrator 1306. Model 1300 assumes that analog components such as the VCO and LPF (e.g., VCO 1070 and LPF 1088 in FIG. 10) can be approximated as discrete time elements. The feed-forward whitening filter and the LPF characteristics are not considered in this model.

In model 1300, if the input frequency steps to a value for which a corrected control word value resides in the lookup table without error, then the DAC output steps to the correct voltage value in a deadbeat manner (no over/undershoot, no error) with a finite delay. The delay through the NCO integrator path 1308 to the NCO output 1310 is designed to equal the delay that is required in the feed-forward path 1312 around the loop to the subtractor 1314. The only critical delays in this design with respect to stability are within the loop; any latencies required in the NCO or the feed-forward paths outside of the loop can be adjusted to be equal between the two input paths and cancel each others' effects (except for a latency in the synthesizer output).

Figure 14A:
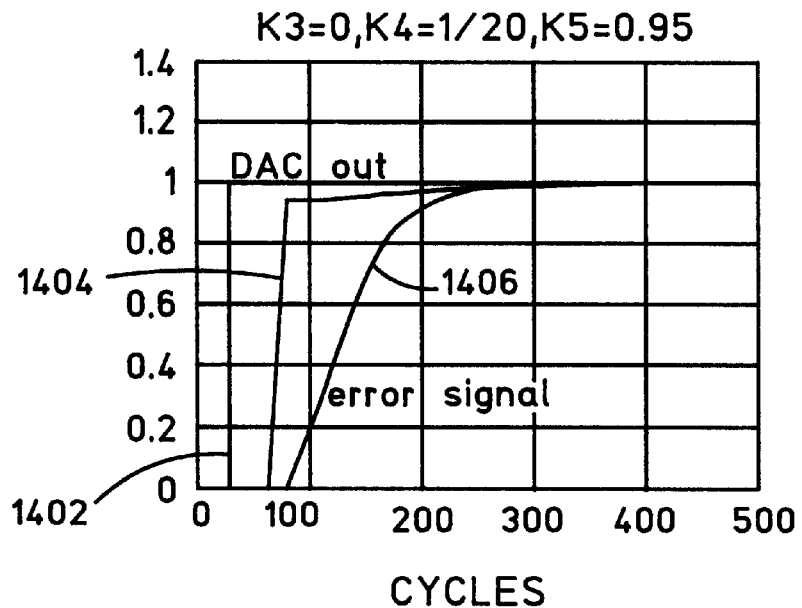
FIGS. 14A–14B illustrate the theoretical performance of the voltage-controlled oscillator (VCO) control linearization diagram of FIG. 13.

As seen in FIG. 14A, the DAC output for a unit step input (for the case of N=7) when the LUT error for the specified frequency step destination is zero can be shown to be the "deadbeat" step function 1402. This trivial result represents the ideal case ($K_5$=1) in which all values of frequency in the LUT specify ideal DAC outputs with no error. The $K_5$ factor 1318 specifies the initial error, which is nonzero when factor 1318 is less than unity.

The response of the loop to an initial error of 5% ($K_5$=0.95) is illustrated by the VCO output curve 1404 in FIG. 14A, which slowly settles over several hundred clock cycles. $K_4$ gain factor 1316 for this case is set to 0.05 and the $K_3$ LUT factor 1320 (FIG. 13) is set to zero to prevent correction of the stored LUT value. This allows the error signal 1406 (seen as the error signal 1322 in FIG. 13) to build up to a steady state.

Figure 14B:
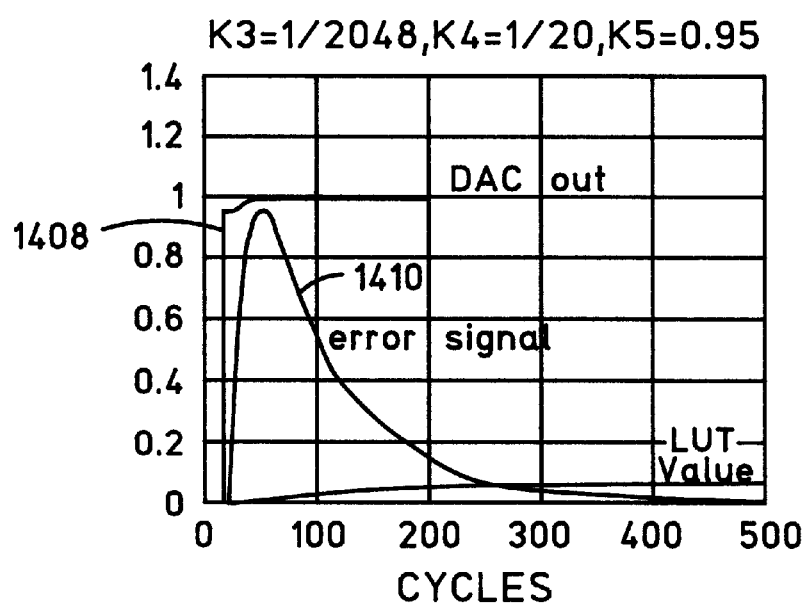

Shown in FIG. 14B is the step response of the system to the DAC output when feed-forward is implemented with an initial 5% error ($K_5$=0.95) and when the LUT error correction is implemented ($K_3$=1/2048) (assuming the same N=7 delay). This case demonstrates the improved performance available from the error correction of the LUT method of this invention. Note also that the error signal 1410 does not build up to a fixed value, but is driven to zero due to the fact that the LUT is accumulating the error. Of great benefit is that the next time that the same frequency is visited, the initial error is much smaller, and the settling time is much faster. In fact, the initial target value of the stored digital control word may be so close to the desired value that the response is effectively deadbeat.

The synthesizer of this invention hops between a first and a second output frequency to settle to within 10% of the initial error within 1/10 of a hop duration. At 100 k hops/sec, this corresponds to 1 $\mu$sec, or 100 clock cycles at 100 MHz. The settling actually occurs much earlier than this 100 clock cycle minimum to allow enough of a dwell at the correct value to add LUT update correction time for the hop carrier frequency. FIG. 14B shows that the VCO control linearization loop model reduces the initial observed error in the DAC output 1408 to 10% of that quantity in less than 30 clock cycles after the hop (compared with the 200 clock cycles required with no correction for DAC output 1404 to settle to within 10% in FIG. 14A), thereby satisfying the criterion and allowing a significant allocation for the slewing.

Figure 15A:
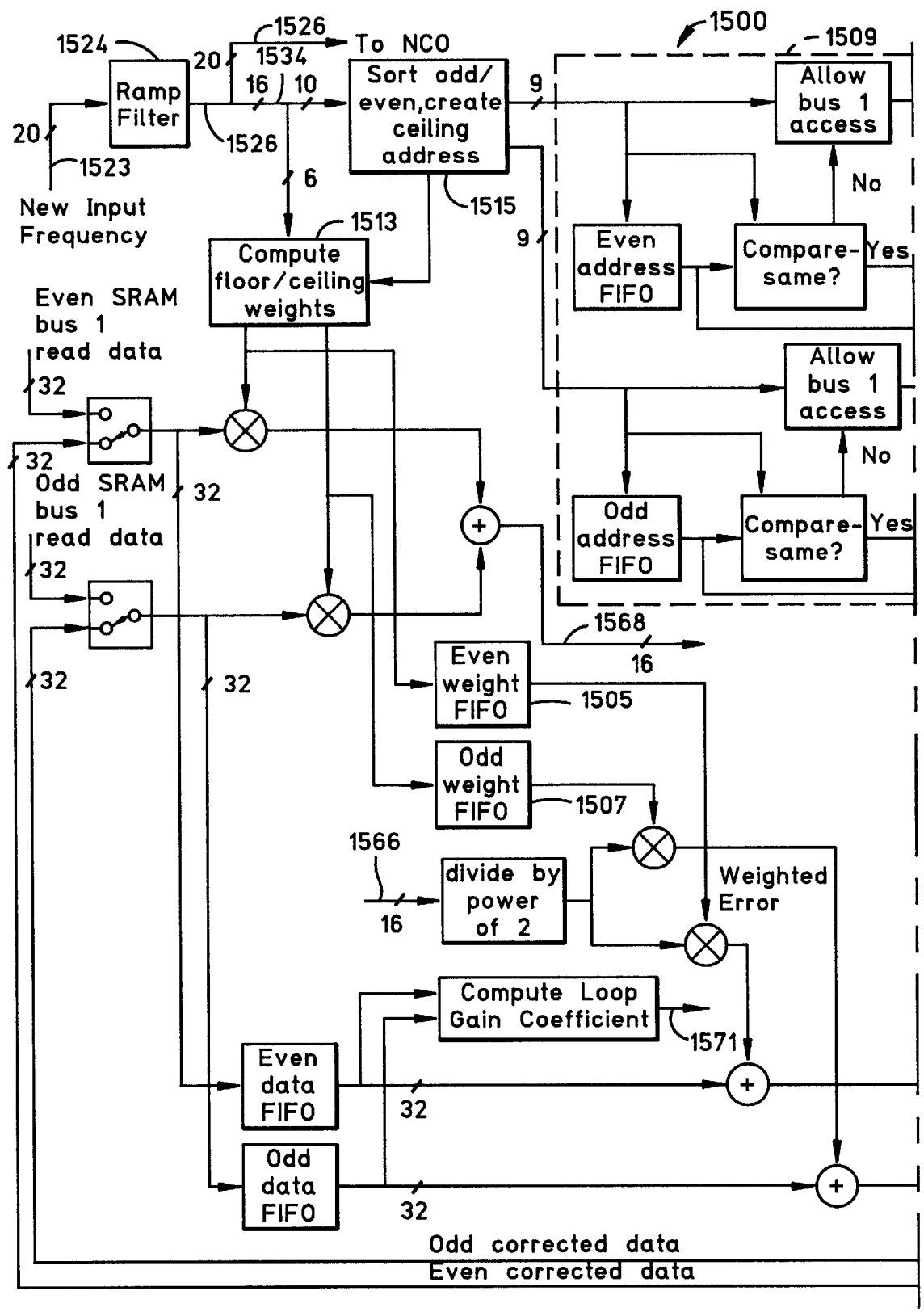
FIGS. 15A–15B, illustrates a block diagram showing an illustrative embodiment of the VCO control linearization loop of the invention.
Figures 15, 15B:
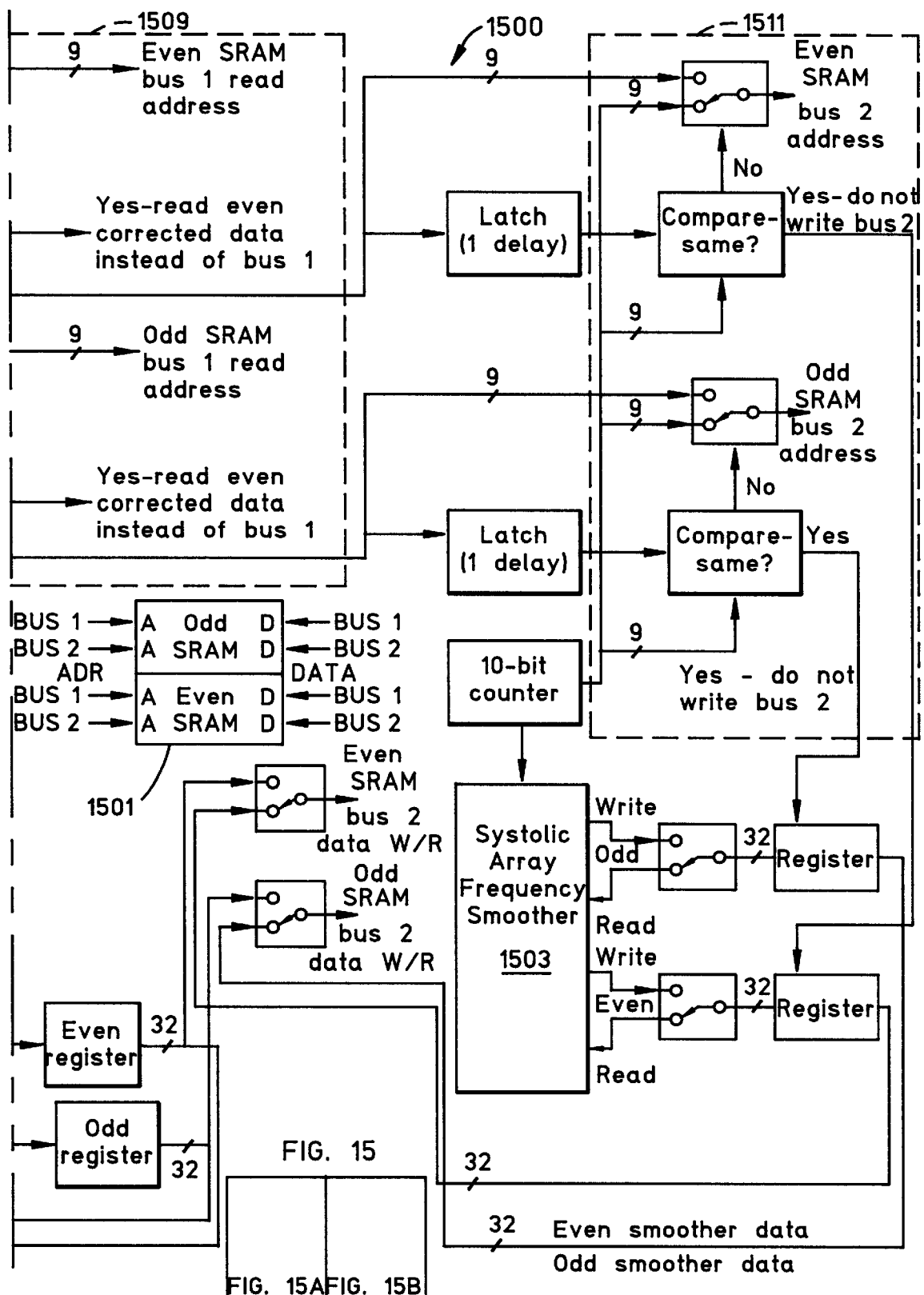
FIG. 15, comprising

The VCO control linearization method of this invention can be appreciated with reference to FIG. 15, comprising FIGS. 15A–15B. FIG. 15 illustrates a useful embodiment of the VCO control linearization loop 1500 of this invention. In FIG. 15, the various components are assigned numerals keyed to the numerals used in FIG. 10 discussed above. For example, ramp filter 1024 (FIG. 10) is the same element as the ramp filter 1524 in FIG. 15, which accepts the 20-bit output frequency word 1523 representing the desired VCO output frequency. Thus, it can be readily appreciated with reference to the above discussion in conjunction with FIG. 10 that VCO control linearization loop 1500 accepts the 16 MSBs 1534 of delayed frequency word 1526 and the 16-bit reconstituted loop error word 1566 and responsively produces a 16-bit corrected feed forward word 1568 representing an estimate of the digital data signal required to produce the VCO analog control signal needed to produce the desired output frequency and a frequency sensitivity signal 1571. The primary means for storing the LUT for this loop is the twin dual-port random-access memory (RAM) 1501, which is organized to store two separate look-up tables (even and odd).

The remaining elements shown in FIG. 15 can be appreciated by those skilled in the art to represent a preferred embodiment of the read-write contention logic and address logic needed for using the pair (even/odd) of dual-port random-access memories (RAMs) 1501 to store and dynamically update detected digital data signal values while simultaneously producing such values responsive to a desired output frequency input for use in producing the proper VCO control signal for the specified output frequency in synthesizer 1000 (FIG. 10). The systolic array 1503 is included in loop 1500 to improve loop performance when the assumption of frequency group linearity is not reliable. Systolic array 1503 operates to smooth the VCO control characteristic in a well-known manner. The FIFO buffers 1505 and 1507 compensate for the delay in systolic array 1503. The contention logic 1509 arbitrates read/write contention for bus 1 and bus 2 of dual-port RAMs 1501. Another contention logic 1511 also arbitrates such contention in conjunction with the smoothing and interpolation functions of loop 1500. The interpolator 1513 accepts the 6-LSBs from digital frequency signal 1526 and the sorter 1515 accepts the 10-MSBs from digital frequency signal 1526. Together, interpolator 1513 and sorter 1515 operate to effect a linear interpolation between digital words for adjacent output frequency cells to improve loop performance in view of the frequency group linearity assumptions mentioned above.

It can be shown that there are many output frequencies that are not visited regularly enough to properly update the stored error correction values. The correction scheme of this invention updates these individual unvisited frequency locations on a regular basis because proper operation assumes that each output frequency is visited regularly enough to develop the dynamic correction value and there are many frequencies in each hop span that are not regularly visited. This is implemented by providing a common correction for a group of output frequencies. The span of each frequency group is selected so that the overall VCO control linearity can be improved by presuming linearity within the frequency group. A single bias value (mean value) and a single frequency versus voltage slope value is used for the group. Whenever one of the frequencies in the group is visited, the group bias value is retrieved from memory and adjusted by a value calculated as the product of the offset distance from the group center and the slope, which is also stored/retrieved from memory. This VCO control linearity correction scheme allows the calculation of the bias and slope values so long as at least two of the group frequencies are visited.

The Sigma-Delta Requantizer

As discussed at length herein above, the output frequency band of the preferred embodiment of the frequency-hopping synthesizer of this invention spans 1,000 MHz. The VCO that develops the output of the synthesizer is regulated by a phase-locked loop and is driven by a DAC through a lowpass filter. At a given temperature, the DAC control voltage output range must span a range representing somewhat more than 1,000 MHz because of thermally-related drift of the VCO output frequency for a given control voltage input. Although the ultimate frequency accuracy of the synthesizer is regulated by the NCO through the phase-lock loop, it is very useful to control the initial accuracy of each new output frequency within 50 kHz. Doing so requires the use of means for specifying about $2^{16}$ discrete output frequencies to the VCO, suggesting the use of a 16-bit DAC for controlling the VCO. Disadvantageously, only 10- to 12-bits are available in the low-cost DACs capable of the 50 MHz to 100 MHz update rates needed for reasonable control loop performance. Sigma-Delta conversion, herein denominated Sigma-Delta requantization, is employed to achieve the necessary 16-bit output frequency resolution while using only 10-bits of DAC resolution.

The Sigma-Delta requantizer of this invention operates to dither between discrete states in such a way that the average value is an intermediary state with extended resolution. The resolution can be selected, and can be enhanced to the extent that the converter (DAC) imperfections are inconsequential. The dithering contains energy at frequencies other than that of the intended waveform or DC voltage level, which can be removed to some extent by filtering. The configuration of the sigma-delta requantizer dictates what power spectral density the dithering process adopts. One attribute of the requantizer is that it develops some error between the quantized output at each sampling instant and the desired higher-precision signal. Because this quantization error can be somewhat random in a uniformly distributed sense over the range of intermediary levels between LSBs of the lower precision output, it can take on a "white noise" uniformly distributed spectrum. Because when the configuration operates in a closed feedback loop, it influences the shape of the "noise" spectrum, the sigma-delta converter is also known in the art as a "noise-shaping feedback loop." Because the desired VCO output frequency resolution is greater than can be provided by readily-available DACs, a Signal-Delta requantizer is included in the synthesizer of this invention to dither the available DAC resolution to produce average values at the desired resolution.

Figure 16:
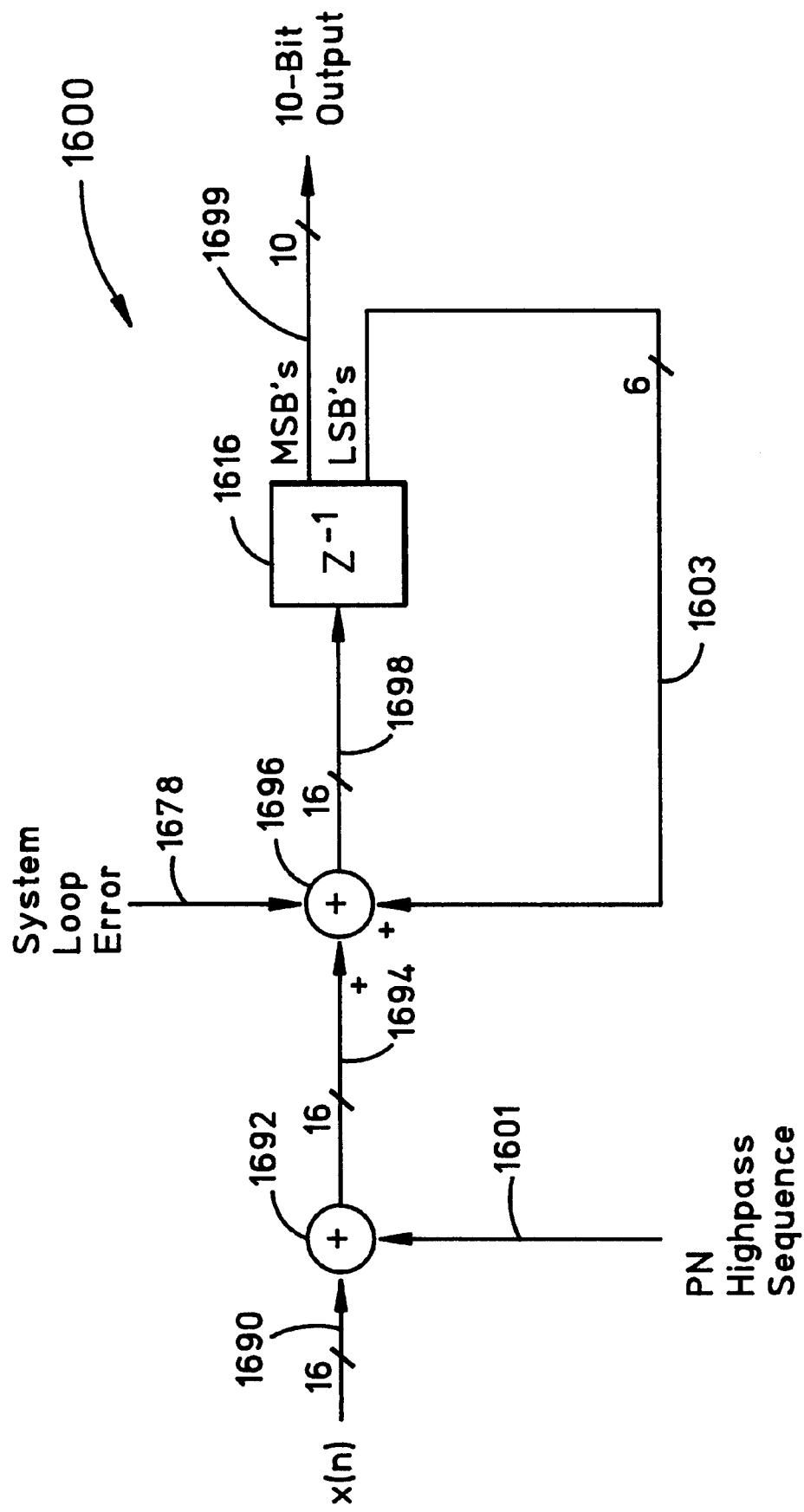
FIG. 16 illustrates a block diagram showing a illustrative embodiment of the Sigma-Delta requantizer of the invention.

FIG. 16 illustrates a useful embodiment of the Sigma-Delta quantizer 1600 of this invention. In FIG. 16, the various components are assigned numerals keyed to the numerals used in FIG. 10 discussed above. For example, quantizer 1600 accepts the 16-bit feed-forward signal 1690, which is analogous to 16-bit feed-forward signal 1090 in FIG. 10, and produces the 10-bit digital data signal 1099, which is analogous to the 10-bit digital data signal 1099 in FIG. 10. Quantizer 1600 places most of the quantizing noise at the half-sample rate where it is filtered off by subsequent analog low-pass filtering (e.g., by LPF 1088 in FIG. 10). A spectrally-shaped dither signal 1601 is also added to 16-bit feed-forward signal 1690 to ensure that the dithering is sufficiently random to minimize the quantizing error energy component amplitudes. Simple dithering, either by alternating sign or by staircase "ramp" functions, contributes unacceptably high discrete spurious modulation, so spectrally-shaped dither signal 1601 uses shaped pseudo-random noise sequences emphasizing energy at the upper fifth of the frequency range, which are added at the digital adder 1692 to produce the dithered feed-forward signal 1694, which is combined with the 16-bit adjusted phase error signal 1678 at the digital adder 1696 to produce the digital data signal 1698, the 6-LSB portion 1603 of which is fed back by the quantizer 1616 to adder 1696. Sigma-Delta quantizer 1616 uses the 10-MSBs of digital data signal 1698 to produce digital data signal 1699 to drive the VCO apparatus discussed above in conjunction with FIGS. 1, 4 and 10.

Clearly, in view of these teachings, other embodiments and modifications of this invention may occur readily to those of ordinary skill in the art. Therefore, the invention is to be limited only by the following claims, which comprise all such obvious embodiments and modifications, viewed in conjunction with the above specification and accompanying drawing.

We claim:

1. A fast frequency-hopping synthesizer apparatus for generating an output signal having a frequency that hops from a first output signal frequency to a second output signal frequency within an output frequency band responsive to an input signal representing a desired output signal, the apparatus comprising:
   a clock circuit producing a clock frequency;
   an output phase sampler receiving the clock frequency and producing a digital phase signal representing the phase of a sampling-induced alias of the output signal;
   a numerically-controlled oscillator receiving the clock frequency and producing a digital reference signal representing the phase of an alias of the desired output signal, the alias having a frequency within a reference frequency band disposed within the Nyquist sampling-limits of the clock frequency;
   a phase control circuit coupled to the numerically-controlled oscillator and to the output phase sampler and producing a control signal representing a combination of the digital reference signal and the digital phase signal; and
   a voltage-controlled oscillator coupled to the phase control circuit and generating the output signal responsive to the control signal, whereby the output signal frequency is controlled by a combination of the desired output signal alias and the sampling-induced output signal alias.

2. The apparatus of claim 1 further comprising:
   in the output phase sampler,
      a local signal generator receiving the clock frequency and producing a local signal pair whose frequency is in the output frequency band,
      a quadrature mixer receiving the output signal and the local signal pair and producing a pair of baseband alias signals each representing a sampling-induced alias of the product of the output signal and one of the pair of local signals, and
      an argument function receiving the baseband alias signal pair and producing the digital phase signal.

3. The apparatus of claim 2 further comprising:
   in the local signal generator,
      a harmonic signal generator receiving the clock frequency and generating a plurality of clock harmonic components each having a frequency in the output frequency band, and
      a first power splitter coupled to the harmonic signal generator and producing the local signal pair.

4. The apparatus of claim 3 further comprising:
   in the quadrature mixer,
      a second power splitter receiving the output signal and producing an output signal pair,
      a dual mixer receiving the local signal pair and the output signal pair and producing a pair of quadrature product signals, and
      a dual low-pass filter receiving the quadrature product signal pair and producing the baseband alias signal pair.

5. The apparatus of claim 4 wherein the output signal has a phase, the apparatus further comprising:
   a cyclic error removal loop coupled to the phase control circuit and producing a digital cyclic error signal representing an estimated variation from a predetermined value of a ratio of the digital phase signal and the output signal phase.

6. The apparatus of claim 5 further comprising:
   a voltage-controlled oscillator control linearization loop coupled to the phase control circuit and producing a digital data signal representing an estimated value of a ratio of the output signal frequency and the control signal.

7. The apparatus of claim 4 further comprising:
   a voltage-controlled oscillator control linearization loop coupled to the phase control circuit and producing a digital data signal representing an estimated value of a ratio of the output signal frequency and the control signal.

8. The apparatus of claim 2 further comprising:
   in the local signal generator,
      a frequency multiplier receiving the clock frequency and generating a clock harmonic component having a frequency in the output frequency band, and
      a first power splitter coupled to the frequency multiplier and producing a local signal pair.

9. The apparatus of claim 8 further comprising:
   in the quadrature mixer,
      a second power splitter coupled to the output signal and producing an output signal pair;
      a dual mixer receiving the local signal pair and the output signal pair and producing a pair of quadrature product signals; and
      a dual sample-and-hold circuit receiving the clock frequency and under-sampling each of the pair of quadrature product signals to produce the baseband alias signal pair.

10. The apparatus of claim 9 wherein the output signal has a phase, the apparatus further comprising:
    a cyclic error removal loop coupled to the phase control circuit and producing a digital cyclic error signal representing an estimated variation from a predetermined value of a ratio of the digital phase signal and the output signal phase.

11. The apparatus of claim 10 further comprising:
    a voltage-controlled oscillator control linearization loop coupled to the phase control circuit and producing a digital data signal representing an estimated value of a ratio of the output signal frequency and the control signal.

12. The apparatus of claim 9 further comprising:
    a voltage-controlled oscillator control linearization loop coupled to the phase control circuit and producing a digital data signal representing an estimated value of a ratio of the output signal frequency and the control signal.

13. The apparatus of claim 1 further comprising:
    a voltage-controlled oscillator control linearization loop coupled to the phase control circuit and producing a digital data signal representing an estimated value of a ratio of the output signal frequency and the control signal.

14. The apparatus of claim 13 further comprising:
    a feed-forward path receiving the input signal and producing a digital feed-forward signal corresponding to the desired output signal; and
    means for adjusting the digital data signal responsive to the digital feed-forward signal.

15. The apparatus of claim 13 further comprising:
    in the phase control circuit,
       a digital phase control circuit generating a first digital data signal representing a combination of the digital reference signal and the digital phase signal;

a sigma-delta requantizer coupled to the digital phase control circuit and producing a second digital data signal representing a predetermined portion of the most-significant bits (MSBs) of the first digital data signal; and a digital-to-analog converter coupled to the sigma-delta requantizer and producing, from the second digital data signal, an analog signal representing the control signal.

16. The apparatus of claim 1 wherein the output signal has a phase, the apparatus further comprising:

a cyclic error removal loop coupled to the phase control circuit and producing a digital cyclic error signal representing an estimated variation from a predetermined value of a ratio of the digital phase signal and the output signal phase.

17. The apparatus of claim 16 further comprising:

in the cyclic error removal loop, a Nyquist band register producing a digital Nyquist band signal representing a reference frequency band multiple corresponding to the desired output frequency, and means for adjusting the digital cyclic error signal responsive to the digital Nyquist band signal.

18. The apparatus of claim 1 wherein the frequency hop from the first output signal frequency to the second output signal frequency is substantially greater than the reference frequency bandwidth.

19. The apparatus of claim 1 wherein the output signal has a phase that is substantially continuous during the frequency hop from the first output signal frequency to the second output signal frequency.

20. A machine-implemented method for generating an output signal that hops from a first output frequency to a second output frequency within an output frequency band responsive to an input signal representing the desired output signal, the method comprising the steps of:

(a) generating a clock frequency;

(b) generating a digital phase signal representing the phase of a sampling-induced alias of the output signal;

(c) generating a digital reference signal representing the phase of an alias of the desired output signal, the alias having a frequency within a reference frequency band having a bandwidth within the Nyquist sampling-limits of the clock frequency; and (d) generating the output signal as a function of a combination of the digital reference signal and the digital phase signal, whereby the output signal frequency is controlled by a combination of the desired output signal alias and the sampling-induced output signal alias.

21. The method of claim 20 wherein the generating step (b) further comprises the steps of:

(b.1) generating a local signal pair whose frequency is in the output frequency band;

(b.2) mixing the local signal pair and the output signal to produce a pair of baseband alias signals each representing an alias of the product of the output signal and one of the pair of local signals; and (b.3) generating the digital phase signal from the phase of a vector represented by the baseband alias signal pair.

22. The method of claim 21 wherein the generating step (b.1) further comprises the steps of:

(b.1.1) generating a plurality of clock harmonic components each having a frequency in the output frequency band; and (b.1.2) generating a local signal pair corresponding to one of the clock harmonic components.

23. The method of claim 22 wherein the mixing step (b.2) further comprises the steps of:

(b.2.1) generating a pair of the output signals;

(b.2.2) mixing the local signal pair and the output signal pair to produce a pair of quadrature product signals; and (b.2.3) low-pass filtering the quadrature product signal pair to produce the baseband alias signal pair.

24. The method of claim 23 wherein the generating step (b.3) comprises the steps of:

(b.3.1) generating a digital cyclic error signal representing an estimated variation from a predetermined value of a ratio of the digital phase signal and the output signal phase; and (b.3.2) modifying the digital phase signal responsive to the digital cyclic error signal.

25. The method of claim 24 wherein the generating step (d) comprises the steps of:

(d.1) generating a control signal representing a combination of the digital reference signal and the digital phase signal;

(d.2) generating a digital data signal representing an estimated value of a ratio of the output signal frequency and the control signal; and (d.3) modifying the control signal responsive to the digital data signal.

26. The method of claim 23 wherein the generating step (d) comprises the steps of:

(d.1) generating a control signal representing a combination of the digital reference signal and the digital phase signal;

(d.2) generating a digital data signal representing an estimated value of a ratio of the output signal frequency and the control signal; and (d.3) modifying the control signal responsive to the digital data signal.

27. The method of claim 21 wherein the generating step (c) further comprises the steps of:

(c.1) generating a clock harmonic component having a frequency in the output frequency band; and (c.2) generating a local signal pair corresponding to the clock harmonic component.

28. The method of claim 27 wherein the mixing step (d) further comprises the step of:

(d.1) generating a pair of the output signals;

(d.2) mixing the local signal pair and the output signal pair to produce a pair of quadrature product signals; and (d.3) under-sampling the quadrature product signal pair to produce the baseband alias signal pair.

29. The method of claim 28 wherein the generating step (b.3) comprises the steps of:

(b.3.1) generating a digital cyclic error signal representing an estimated variation from a predetermined value of a ratio of the digital phase signal and the output signal phase; and (b.3.2) modifying the digital phase signal responsive to the digital cyclic error signal.

30. The method of claim 29 wherein the generating step (d) comprises the steps of:

(d.1) generating a control signal representing a combination of the digital reference signal and the digital phase signal;

(d.2) generating a digital data signal representing an estimated value of a ratio of the output signal frequency and the control signal; and (d.3) modifying the control signal responsive to the digital data signal.

31. The method of claim 28 wherein the generating step (d) comprises the steps of:

(d.1) generating a control signal representing a combination of the digital reference signal and the digital phase signal;

(d.2) generating a digital data signal representing an estimated value of a ratio of the output signal frequency and the control signal; and (d.3) modifying the control signal responsive to the digital data signal.

32. The method of claim 20 wherein the generating step (d) comprises the steps of:

(d.1) generating a control signal representing a combination of the digital reference signal and the digital phase signal;

(d.2) generating a digital data signal representing an estimated value of a ratio of the output signal frequency and the control signal; and (d.3) modifying the control signal responsive to the digital data signal.

33. The method of claim 32 wherein the generating step (d.1) further comprises the steps of:

(d.1.1) generating a first digital data signal representing a combination of the digital reference signal and the digital phase signal;

(d.1.2) generating a second digital data signal representing a predetermined portion of the most-significant bits (MSBs) of the first digital data signal; and (d.1.3) generating, responsive to the second digital data signal, an analog signal representing the control signal.

34. The method of claim 32 wherein the generating step (d.2) further comprises the steps of:

(d.2.1) generating a digital feed-forward signal representing the input signal; and (d.2.2) modifying the digital data signal responsive to the digital feed-forward signal.

35. The method of claim 20 wherein the generating step (b) comprises the steps of:

(b.1) generating a digital cyclic error signal representing an estimated variation from a predetermined value of a ratio of the digital phase signal and the output signal phase; and (b.2) modifying the digital phase signal responsive to the digital cyclic error signal.

36. The method of claim 35 wherein the generating step (b.1) further comprises the steps of:

(b.1.1) generating a digital Nyquist band signal representing a multiple of the reference frequency bandwidth encompassing the desired output frequency; and (b.1.2) modifying the digital cyclic error signal responsive to the digital Nyquist band signal.

37. The method of claim 20 wherein the frequency hop from the first output frequency to the second output frequency is substantially greater than the reference frequency bandwidth.

38. The method of claim 20 wherein the output signal has a phase that is substantially continuous during the frequency hop from the first output frequency to the second output frequency.

* * * * *